(12) United States Patent
Saitoh et al.

(10) Patent No.: US 7,217,503 B2
(45) Date of Patent: May 15, 2007

(54) EXPOSURE METHOD AND APPARATUS

(75) Inventors: Kenji Saitoh, Tochigi (JP); Akiyoshi Suzuki, Tokyo (JP); Kenji Yamazoe, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 166 days.

(21) Appl. No.: 10/132,001

(22) Filed: Apr. 24, 2002

(65) Prior Publication Data

US 2002/0177048 A1    Nov. 28, 2002

(30) Foreign Application Priority Data

Apr. 24, 2001  (JP) ............................. 2001-126759
Dec. 3, 2001   (JP) ............................. 2001-369393

(51) Int. Cl.
*G03F 7/20* (2006.01)

(52) U.S. Cl. ...................... 430/311; 430/394

(58) Field of Classification Search ................ 430/5, 430/22, 30, 311, 394; 716/19–21
See application file for complete search history.

(56) References Cited

U.S. PATENT DOCUMENTS

| | | | | |
|---|---|---|---|---|
| 5,153,773 | A |  | 10/1992 | Muraki et al. ............... 359/619 |
| 5,298,365 | A |  | 3/1994 | Okamoto et al. ........... 430/311 |
| 5,367,404 | A |  | 11/1994 | Hayata |
| 5,447,810 | A |  | 9/1995 | Chen et al. ..................... 430/5 |
| 5,621,498 | A | * | 4/1997 | Inoue et al. .................... 430/5 |
| 5,691,803 | A | * | 11/1997 | Song et al. .................... 355/55 |
| 5,985,491 | A |  | 11/1999 | Kim et al. ...................... 430/4 |
| 6,150,059 | A | * | 11/2000 | Tanabe et al. ................. 430/5 |
| 6,355,382 | B1 | * | 3/2002 | Yasuzato et al. ............... 430/5 |
| 6,361,909 | B1 | * | 3/2002 | Gau et al. ..................... 430/30 |
| 6,534,242 | B2 |  | 3/2003 | Sugita et al. |
| 6,607,535 | B1 |  | 8/2003 | Chan |
| 2002/0177054 | A1 |  | 11/2002 | Saitoh et al. |

FOREIGN PATENT DOCUMENTS

| | | |
|---|---|---|
| EP | 0 464 492 A1 | 1/1992 |
| EP | 0464492 A1 | 1/1992 |
| EP | 589103 A1 | 3/1994 |
| EP | 589103 B1 | 3/1994 |
| EP | 0 915 384 A2 | 5/1999 |
| EP | 0 939 343 A1 | 9/1999 |
| EP | 969327 | 1/2000 |
| EP | 1 174 764 | 1/2002 |
| JP | 4-136854 | 5/1992 |
| JP | 5-036585 | 2/1993 |
| JP | 5-047628 | 2/1993 |
| JP | 5-217840 | 8/1993 |
| JP | A 06-163364 | 6/1994 |
| JP | 6-196388 | 7/1994 |
| JP | 06-267822 | 9/1994 |
| JP | A 11-135402 | 5/1999 |
| JP | 20003-310843 | 11/2000 |
| JP | 2001-005197 | 1/2001 |
| JP | A2002-90979 | 3/2002 |
| JP | A2002-122976 | 4/2002 |

OTHER PUBLICATIONS

English translation of JP 6-196388.
English translation of claims 1, 3 and 8 of JP 4-136854.
English abstract of JP 5-036585.
English abstract of JP 5-047628.
English abstract of JP 5-217840.
English abstract of JP 2003-310843.
Communication from European Patent Office dated Feb. 18, 2004 for Application No. 02 722 748.7-1226.
English translation of Japanese Office action dated Dec.21, 2004 for Appl. No. 2002-123268.
English abstract of JPA 11-135402; and.
English abstract of JPA 06-163364.
An Office action from the Korean Patent Office dated Mar. 31, 2005 for Appl. No. 10-2002-7017663.
A Japanese version of the Korean Office action.
English translation of the Korean Office action.

* cited by examiner

*Primary Examiner*—Kathleen Duda
(74) *Attorney, Agent, or Firm*—Morgan & Finnegan, L.L.P.

(57) ABSTRACT

An exposure method comprising the steps of forming onto a mask that arranges a pattern of a contact hole and a plurality of patterns each being smaller than the contact hole pattern, and illuminating the mask using plural kinds of light so as to resolve the desired pattern without the smaller patterns on a target via a projection optical system.

19 Claims, 41 Drawing Sheets

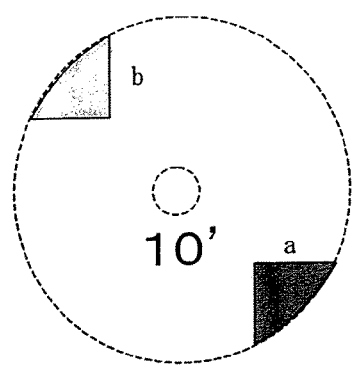
FIG. 39
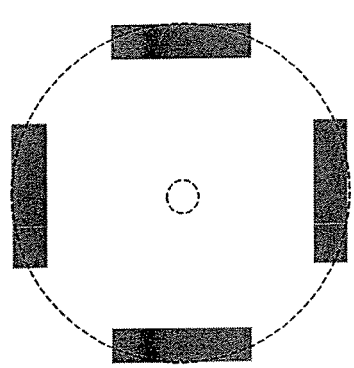 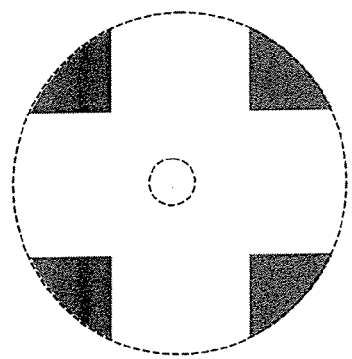
FIG. 40A    FIG. 40B
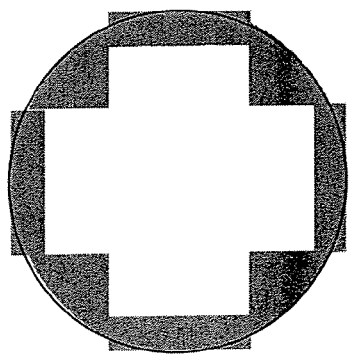
FIG. 40C -0.4 μm   -0.2 μm   0 μm   0.2 μm   0.4 μm -0.4 μm   -0.2 μm   0 μm   0.2 μm   0.4 μm

EXPOSURE METHOD AND APPARATUS

BACKGROUND OF THE INVENTION

The present invention relates generally to exposure, and more particularly to exposure apparatuses and methods, device fabricating methods, and devices fabricated from an object to be exposed or a target object. The exposure apparatus and method are used to fabricate various devices including semiconductor chips such as ICs and LSIs, display devices such as liquid crystal panels, sensing devices such as magnetic heads, and image pick-up devices such as CCDs, as well as fine contact hole patterns used for micromechanics. Here, the micromechanics is technology for applying the semiconductor IC fabricating technique for fabrications of a fine structure, thereby creating an enhanced mechanical system that may operate at a level of micron.

A photolithography process uses an exposure apparatus to transfer a mask pattern onto a photosensitive material (resist) which is applied to a silicon wafer, glass plate, etc. (simply called "wafer" hereinafter), and includes steps of an application of resist, exposure, development, etching and a removal of the resist. For the exposure in this series of steps, resolution, overlay accuracy and throughput are three important factors. The resolution is the minimum size for a precise transfer. The overlay accuracy is precision in overlaying multiple patterns over a wafer. The throughput is the number of sheets processed per unit of time.

The fabrication of a device using the lithography technique has employed a projection exposure apparatus that uses a projection optical system to project a pattern drawn on a mask or reticle (these terms are used interchangeably in this application) onto a wafer, thereby transferring the pattern. The projection optical system enables diffracted beams from the pattern to interfere on a wafer and forms an image. The normal exposure enables 0-th order and ±1st order diffracted beams (namely, three beams) to interfere with each other.

Mask patterns include an adjacent and periodic line and space (L & S) pattern, a line of contact holes that are adjacent and periodic (i.e., arranged at the same interval as the hole diameter), isolated contact holes that are non-adjacent and isolated, other isolated patterns, etc., and a transfer of a pattern with high resolution requires a selection of optimal exposure conditions (such as illumination conditions, exposure light amount, etc.) in accordance with kinds of patterns.

The resolution R of a projection exposure apparatus is given in the following Rayleigh equation:

$$R = k_1(\lambda/NA) \quad (1)$$

where $\lambda$ is a wavelength of a light source, NA is a numerical aperture of the projection optical system, $k_1$ is a constant determined by a development process and others. In a normal exposure case, $k_1$ is approximately 0.5–0.7.

The recent demand for highly integrated devices have increasingly required more fine patterns to be transferred or higher resolution. Although the above equation reveals that the higher numerical aperture NA and reduced wavelength $\lambda$ would effectively achieve the higher resolution, improvements of these factors have already reached the limit at the current stage. Thus, it is difficult for the normal exposure to form a pattern of 0.15 µm or less onto a wafer. Accordingly, it has been suggested to employ the phase shift mask technology that enables two beams out of those diffracted beams which have passed through a pattern to interfere with each other, thus forming an image. The phase shift mask reverses, by 180°, phases of adjacent light-transmitting portions on it, and cancels out the 0-th order diffracted beam, thus enabling two ±1st order diffracted beams to interfere with each other and forming an image. Use of this technique would reduce $k_1$ in the above equation down to substantially 0.25, thus improving the resolution R and forming a pattern of 0.15 µm or less onto a wafer.

However, when adjacent phases are altered by 180° for fine contact holes near the resolution limit, light is diffracted at a wide angle from the optical axis, i.e., in a direction of 45° on the pupil plane and, and deviates from the pupil in the projection system. As a result, the diffracted light can neither pass the pupil in the projection lens nor resolve. What can resolve is, at best, a fine pattern down to square root 2 times a marginal critical dimension in the L & S. Therefore, a contact line of holes (or contact holes array) has been demanded to have resolution equivalent to that of the L & S pattern.

Moreover, the recent semiconductor industry has been shifting its production to system chips that include highly value-added and various types of patterns, and thus it has become necessary to form more than one kind of contact hole pattern on a mask. However, a prior art phase shift mask has not yet sufficiently exposed, at one time with high resolution, a contact hole pattern blended with a contact hole line and an isolated contact hole. It is, on the other hand, conceivable to use the double exposure (or multiple exposure) with two masks to expose different kinds of patterns separately, but the conventional double exposure requires two masks and incurs many practical disadvantages: That is, this approach results in an increased cost and lowered throughput because of two exposure steps, as well as requiring high overlay accuracy for two mask exchanges.

BRIEF SUMMARY OF THE INVENTION

Accordingly, it is an exemplary object of the present invention to provide an exposure method and apparatus that can expose, without exchanging a mask, a contact hole pattern that has a fine hole diameter (e.g., of 0.15 µm or less) and blends from an (isolated) contact hole to a contact hole line, with high resolution (i.e., with such resolution for the contact hole line as is equivalent to that of the L & S pattern that uses the phase shift mask).

In order to achieve the above object, an exposure method as one aspect according to the present invention includes the steps of providing a mask that arranges a pattern of a contact hole and a plurality of patterns each being smaller than the contact hole pattern, and illuminating the mask using plural kinds of light so as to resolve the contact hole pattern without the smaller patterns on a target via a projection optical system. This exposure method uses plural kinds of illumination light (e.g., illumination different from normal annular illumination) simultaneously or sequentially, and forms the desired pattern, after development, by properly selecting a threshold (of a resist) on the target surface. The mask and its fabricating method also constitute another aspect of the present invention.

The contact hole pattern on the mask may have a diameter different from an original diameter to be formed on the target. The plural kinds of light may include first illumination light whose intensity distribution has a peak near an optical axis, and second illumination whose intensity distribution has a peak off the optical axis. Alternatively, the plural kinds of light may include large σ illumination and small σ illumination. The plural kinds of light may include first and second illumination light, the first illumination enabling two diffracted beams generated from the desired pattern to be incident upon a pupil plane in the projection optical system, the second illumination preventing any diffracted beam from being incident upon an area on the pupil plane which area is defined by linearly connecting the two diffracted beams.

The second illumination may be set so that only one diffracted beam to be incident upon the pupil plane. The plural kinds of light may form an effective light source having σ larger than 0.9. The mask may be adapted to a phase shift mask that sets phases of 0 and 180 degrees checkerwise for the desired pattern. There may be plural kinds of auxiliary patterns as the smaller patterns, a size of the auxiliary pattern adjacent to the desired pattern is made smaller than that of another auxiliary pattern. The plural kinds of light may include a substantially annular effective light source and a quadrupole light source having σ larger than 0.9 at an outer circumference.

An exposure method as another aspect of the present invention include the steps of forming onto a mask that arranges a pattern of a contact hole and a plurality of patterns each being smaller than the contact hole pattern, and illuminating the mask using light forming an effective light source that has a non-circular dark portion at a center portion thereof, so as to resolve the contact hole pattern without the smaller patterns on a target via a projection optical system. The non-circular dark portion may have a cross shaped. The mask and its fabricating method also constitute another aspect of the present invention.

The small σ illumination may form a circular effective light source having σ of 0.3 or less. The large σ illumination may form an effective light source of crossed four figures. The large σ illumination may form an annular effective light source. The four figures may have illumination light with an equal σ. The large σ illumination may have σ of 0.6 or greater at a center of illumination light. The first σ illumination may form an effective light source of crossed four figures. The mask may use a phase shift mask, and the second illumination may have a rectangular effective light source having a rectangular, circular or approximately rhomboid hollow. The mask may use a binary or half tone mask, and the second illumination may have an effective light source of crossed four sectors. The mask may use a binary or phase shift mask to form various effective light sources. The effective light source may have σ larger than 0.9 at an outer circumference, and the effective light source may form the cross dark portion at a center of a circular light source. The effective light source may have σ larger than 1.0 at an outer circumference. The plural exposures may be repeated while a positional relationship in an optical axis of the projection optical system between the target and an image of the desired pattern is changed. The desired pattern and the auxiliary pattern may be two-dimensionally arranged like a matrix.

An exposure apparatus as still another aspect of the present invention includes an exposure mode for performing the above exposure method. The exposure apparatus exhibits an operation of the above exposure method. The exposure apparatus may further include an illumination optical system that includes an aperture stop, said aperture stop having first and second light transmitting parts and a light blocking part, the first light transmitting part contributing to resolution of the second pattern, the second light transmitting part enhancing an optical strength distribution for the second pattern, a ratio of areas between the first and second light transmitting parts being in a range from 0.06 to 1.30. The exposure apparatus may further include an illumination optical system that includes an aperture stop, said aperture stop having a light transmitting part and a light blocking part, the area of the light blocking part being variable.

An exposure apparatus of another aspect of the present invention includes a mechanism for adjusting a ratio of illumination light volume between first illumination and second illumination, the first illumination having an effective light source having crossed four figures corresponding to a longitudinal and transverse axes of an array of contact hole, and the second illumination having another effective light source.

A device fabricating method as still another aspect of the present invention includes the steps of exposing the target using the above exposure apparatus, and performing a given process for the exposed target. claims for the device fabricating method that exhibits operations similar to those of the above exposure apparatus cover devices as their intermediate products and finished products. Moreover, such devices include, e.g., semiconductor chips such as LSIs and VLSIs, CCDs, LCDs, magnetic sensors, thin-film magnetic heads, etc.

A mask of another aspect of the present invention two-dimensionally arranges a pattern of a contact hole and plural kinds of auxiliary patterns each being smaller than the contact hole pattern, wherein a size of the auxiliary pattern adjacent to the contact hole pattern is made smaller than that of another auxiliary pattern. The auxiliary pattern may have a size corresponding to about 55% to 90% of the hole diameter in the desired pattern. The mask may be adapted to a phase shift mask that forms the two-dimensionally arranged the desired pattern by setting phases of 0 and 180 degrees checkerwise.

A projection exposure method of another aspect of the present invention includes the steps of providing a mask that arranges a pattern of a contact hole and a plurality of patterns each being smaller than the contact hole pattern, and illuminating the mask with fist illumination for resolving the contact hole pattern, and second illumination for preventing a false resolution caused by the smaller patterns and the first illumination.

According to the instant specification, what is represented by σ indicates a size and position of such an object as an aperture image in a stop for illumination (i.e., an effective light source) to a diameter of an aperture (or pupil) of an aperture stop in a projection optical system.

Other objects and further features of the present invention will become readily apparent from the following description of the embodiments with reference to accompanying drawings.

BRIEF DESCRIPTION OF THE DRAWINGS

FIG. 39 shows one example of an effective light source distribution.

FIG. 40 is a typical view for explaining an effective light source distribution.

DETAILED DESCRIPTION OF THE PREFERRED EMBODIMENTS

Figure 1:
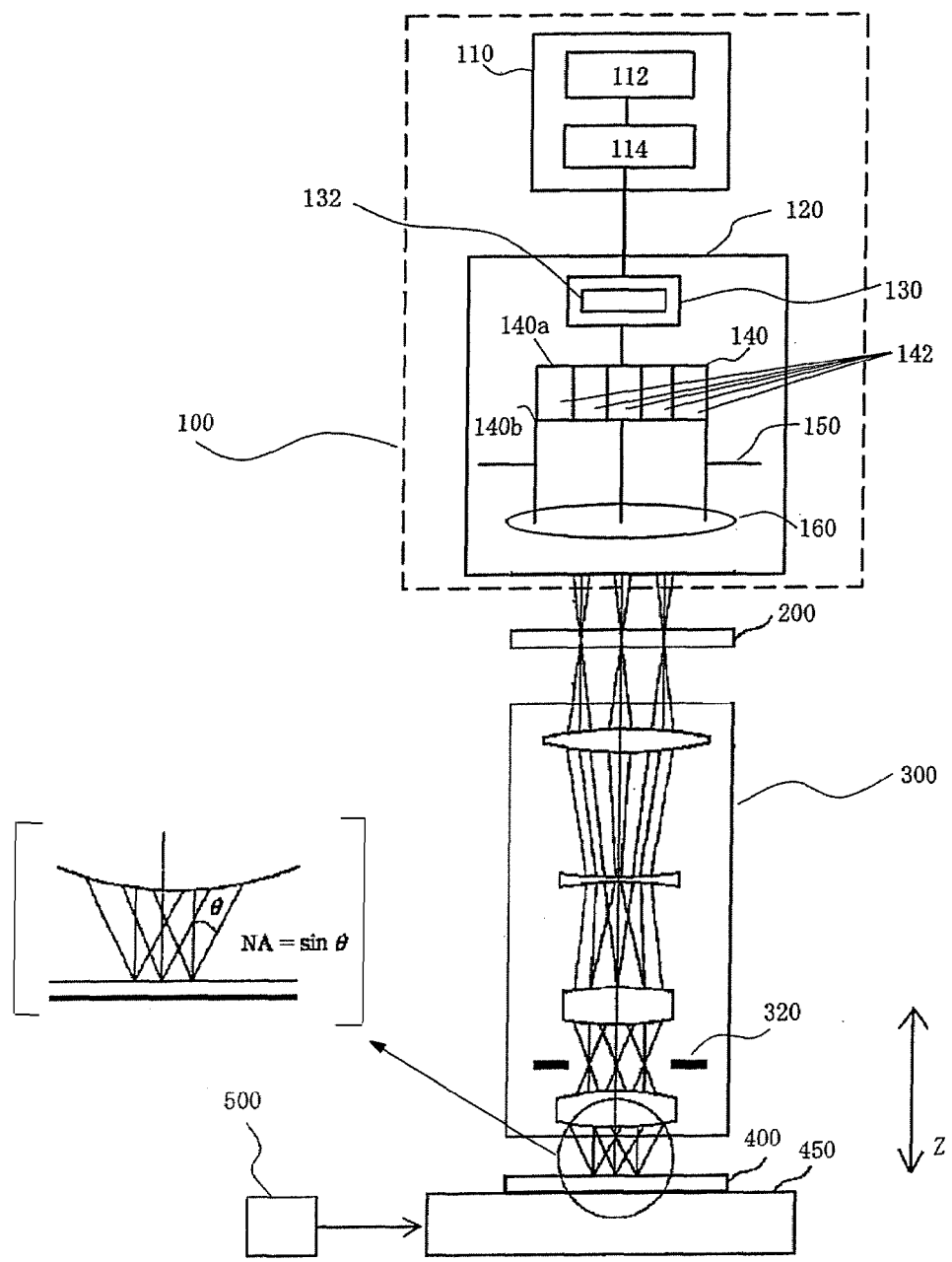
FIG. 1 is a schematic block diagram of an exposure apparatus of the present invention.

A description will now be given of an exemplary exposure apparatus of the present invention with reference to the accompanying drawings. Here, FIG. 1 is a schematic block diagram of the exposure apparatus of the present invention. As shown in FIG. 1, the exposure apparatus includes an illumination section 100, a mask 200, a projection optical system 300, a plate 400, a stage 450, and an image-forming position adjuster 500.

The exposure apparatus of the present embodiment is a projection exposure apparatus that exposes onto the plate 400 a circuit pattern created on the mask 200 in a step-and-scan manner, but the present invention can apply a step-and-repeat manner and other exposure manners. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The illumination apparatus 100 illuminates the mask 200 on which a circuit pattern to be transferred is created, and therefore, includes a light source section 110 and an illumination optical system 120.

The light source section 110 includes laser 112 as a light source, and a beam shaping system 114.

The laser 112 may use pulse laser such as ArF excimer laser with a wavelength of approximately 193 nm, KrF excimer laser with a wavelength of 248 nm, $F_2$ excimer laser with a wavelength of 157 nm, etc. A kind of laser is not limited to excimer laser. For example, YAG laser can be used, and the number of laser units is not limited. For example, if two units of solid laser that operates independently are used, no coherence between these solid laser units exists, and thus speckles arising from the coherence will be reduced considerably. Further, in order to reduce speckles, it would be advisable to oscillate an optical system in a straight or rotating manner. Moreover, a light source applicable to the light source section 110 is not limited to the laser 112, but may use one or more lamps such as a mercury lamp, xenon lamp, etc.

The beam shaping system 114 can use, for example, a beam expander, etc., with a plurality of cylindrical lenses, and convert an aspect ratio of the size of the sectional shape of a parallel beam from the laser 112 into a desired value (for example, by changing the sectional shape from a rectangle to a square), thus reshaping the beam shape to a desired one. The beam shaping system 114 forms a beam that has a size and divergent angle necessary for illuminating an optical integrator 140 described later.

Preferably, the light source section 110 uses an incoherently turning optical system, though it is not shown in FIG. 1, which turns a coherent laser beam into an incoherent one. The incoherently turning optical system may use an optical system that includes at least one return system, for example, as disclosed in FIG. 1 in Japanese Laid-Open Patent Application No. 3-215930, which splits an incident beam on a light splitting plane into at least two beams (e.g., p polarized light and s polarized light). The return system then provides one of them, relative to the other, with an optical path length difference more than the coherence length of a laser beam via an optical member, and subsequently leads it to the light splitting plane so that the superimposed light is emitted.

The illumination optical system 120 is an optical system that illuminates the mask 200, and includes a condensing optical system 130, an optical integrator 140, an aperture stop 150, and a condenser lens 160 in this embodiment. The illumination optical system 120 can use any light whether it is on-axial or off-axial light. Further, the illumination optical system 120 in this embodiment may include a masking blade or a scan blade for changing a size of the transfer area onto the plate 400. The illumination optical system 120 in this embodiment comprises a plurality of lenses and necessary mirrors, and makes up an afocal system that is telecentric at the side of exit.

The condensing optical system 130 includes a necessary deflecting mirror(s) and a lens(es), and efficiently introduces a beam that has passed through them into the optical integrator 140. For example, the condensing optical system 130 includes a condenser lens that is arranged so that a plane of exit of the beam shaping system 114 and the plane of incidence of an optical integrator 140 as a fly-eye lens as described later may form an optical relationship of an object plane and a pupil plane (or a pupil plane and an image plane), thereby keeping the chief ray which has passed the lens parallel to any lens element 142 in and around the center of the optical integrator 140. This relationship is sometimes called a Fourier transformation relationship in this application.

The condensing optical system 130 further includes an exposure-amount regulator 132 which can change an exposure amount of illumination light for the mask 200 per illumination. The exposure-amount regulator 132 changes each magnification in the afocal system, thereby altering a sectional shape of an incident beam. Alternatively, the exposure-amount regulator 132 may be composed of a zoom lens and the like to move the lens along the optical axis and change the angular magnification. If necessary, the exposure-amount regulator 132 may use a half mirror to split an incident beam, detect an amount of light by a sensor, and regulate, based on the result of the detection, an output of the laser 112 and/or part in the optical system. By replacing an optical element (e.g., light amount regulating (ND) filter) and/or using a zoom lens to change image-forming magnification, the exposure-amount regulator 132 may also regulate a ratio of the light volume between the central and peripheral parts of the aperture stop 150, which will be described later. The exposure-amount regulator 132 may regulate the exposure amount based on the desired pattern of contact holes and/or contrast sought at the plate 400. The exposure-amount regulator 132 in this embodiment also serves to regulate a peak position in the illumination light (large σ illumination) that has the peak position off the optical axis in its intensity distribution.

The optical integrator 140, which makes uniform illumination light that illuminates the mask 200, is structured as a fly-eye lens in this embodiment, which converts an angular distribution of incident light to a positional distribution, thus exiting the light. The fly-eye lens is so maintained that its plane of incidence 140a and its plane of exit 140b are in the Fourier transformation relationship. However, as described later, the optical integrator 140 usable for the present invention is not limited to the fly-eye lens.

The fly-eye lens 140 arranges a plurality of lenses (lens elements) 142 which have different focus positions on the other plane. A sectional shape of each lens element that forms the fly-eye lens will have higher light use efficiency for the illumination light when it is approximately similar to the illuminated area in the illumination section, provided each lens element has a spherical lens surface. This is because the plane of light incidence and the illuminated area are in the relationship of an object and an image (i.e., a conjugate relationship).

Although this embodiment forms the fly-eye lens by combining many lens elements of a square section in conformity to a shape of the mask 200, the present invention does not exclude those lenses having a circular, rectangular, or hexagonal section or any other shape. The condenser lens 160 superimposes, onto the mask 200, each beam from multiple point-light sources (effective light sources) that is formed at or around the plane of exit 140b of the fly-eye lens. Thus, the entire mask 200 will be illuminated by multiple point-light sources (effective light sources) in a uniform way.

The fly-eye lens 140 may be replaced with an optical rod. The optical rod turns a illumination distribution, which has not been uniform at the plane of incidence, uniform at the plane of exit, and has a rectangular section wherein a sectional shape perpendicular to a rod axis has an approximately same aspect ratio as the illuminated area. If the optical rod has power with respect to the sectional shape perpendicular to the rod axis, the intensity of illumination at the plane of exit does not become uniform, and thus the sectional shape perpendicular to the rod axis is a polygon formed only by straight lines. The fly-eye lens 140 may be replaced with a diffractive element exhibiting a diffusive behavior.

Right after the plane of exit 140b of the optical integrator 140 is provided the aperture stop 150 whose shape and diameter are fixed. The aperture stop 150 in this embodiment has an aperture shape for illuminating the mask 200 by using crossed oblique incidence illumination for resolving contact holes 210, illumination that restrains a dummy resolution generated by the crossed oblique incidence illumination (i.e., by keeping low an exposure amount corresponding to the dummy resolution pattern (i.e., with the small increase of the exposure amount) and by highlighting an exposure amount of a desired pattern of contact holes (i.e., with the large increase of the exposure amount)). The aperture stop 150 is provided in a conjugate position with the pupil plane 320 of the projection optical system 300. The aperture shape of the aperture stop 150 corresponds to an effective light source shape on the pupil plane 320 in the projection optical system 300.

The aperture stop 150 of one this embodiment uses illumination light having its peak near the optical axis and illumination light having its peak off the optical axis (namely, projects these beams sequentially or as one combined beam), and has an aperture shape for illuminating the mask 200. The present invention may (1) prepare two aperture stops, one of which provides illumination light having its peak near the optical axis and the other of which provides illumination light having its peak off the optical axis, and (2) use these aperture stops one-by-one to illuminate the mask 200. One of the characteristics of the present invention is to solve problems that associate with an exchange of the mask 200. So long as the mask 200 is not exchanged, there will be no problem as to exchanging the aperture stop 150.

The illumination light having its peak near the optical axis has σ of 0.3 or less, and brings about interference between 0-th order and ±1st order diffracted beams. The illumination light having its peak off the optical axis has σ of 0.6 or greater, and brings about interference between 0-th order and +1st or −1st order diffracted beams. Here, σ is the numerical aperture (NA) at the side of the mask 200 in the illumination optical system 120 as opposed to NA at the side of the mask 200 in the projection optical system 300. The illumination light having its peak near the optical axis is small σ illumination, sometimes called normal illumination. The illumination light having its peak off the optical axis is large σ illumination, sometimes called oblique incidence illumination or modified illumination.

Figure 2:
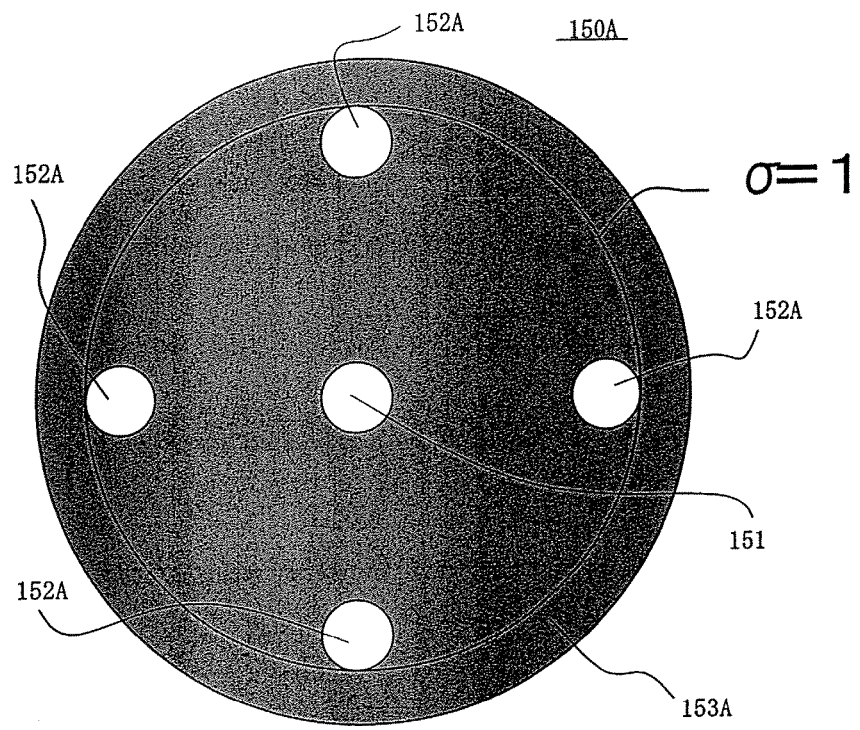
FIG. 2 is a schematic plan view showing an exemplary shape of an aperture stop in the exposure apparatus shown in FIG. 1.

Referring now to FIGS. 2–7, a description will be given of exemplary shapes applicable to the aperture stop 150. Here, FIGS. 2–7 are schematic plan views of exemplary shapes of the aperture stop 150. FIG. 2 is a schematic plan view of an aperture stop 150A formed as a stop for quintuple-pole illumination. The aperture stop 150A has one circle 151 in its center, and four circles 152A with σ of 1 or less, arranged at 0, 90, 180 and 270 degrees (in other words, in a cross-shaped way). The aperture stop 150A has light transmitting parts with transmittance of 1, consisting of circles 151 and 152A, and a light shielding part 153A with transmittance of 0.

Here, a circle of σ=1, as shown, corresponds to an (circular) outline of an image of an aperture in the aperture stop 150 when the stop 150 in the projection optical system 300 is projected, in a reverse direction, onto each stop for illumination. Therefore, it may be said that an aperture in a stop shown in each figure in this application is an effective light source to be projected upon an aperture (σ=1) in the aperture stop in the projection optical system.

The circle 151 provides circular illumination light having its peak near the optical axis. On the other hand, the circle 152A originates quadrupole illumination light having its peak off the axis. Preferably, the illumination light which each circle 152A provides has equal σ. The circles 151 and 152A in the aperture stop 150A have the same size.

The illumination having its peak off the optical axis is sometimes called large σ illumination, oblique incidence illumination, or modified illumination, thus having various variations. For example, four circles may be replaced with other arbitrary figures.

Figure 3:
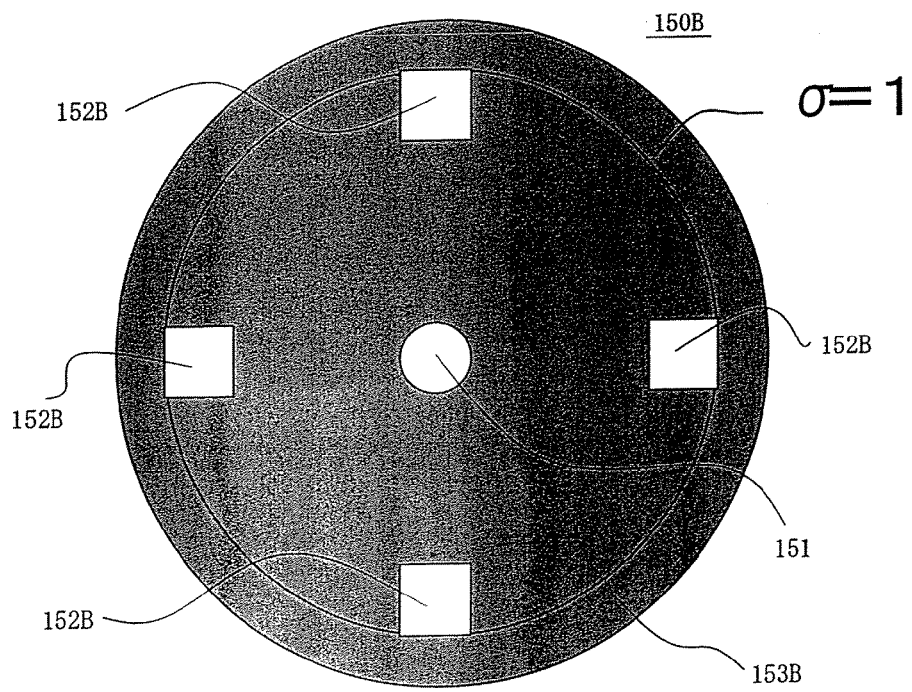
FIG. 3 is a schematic plan view showing another exemplary shape of an aperture stop shown in FIG. 1.
Figure 4:
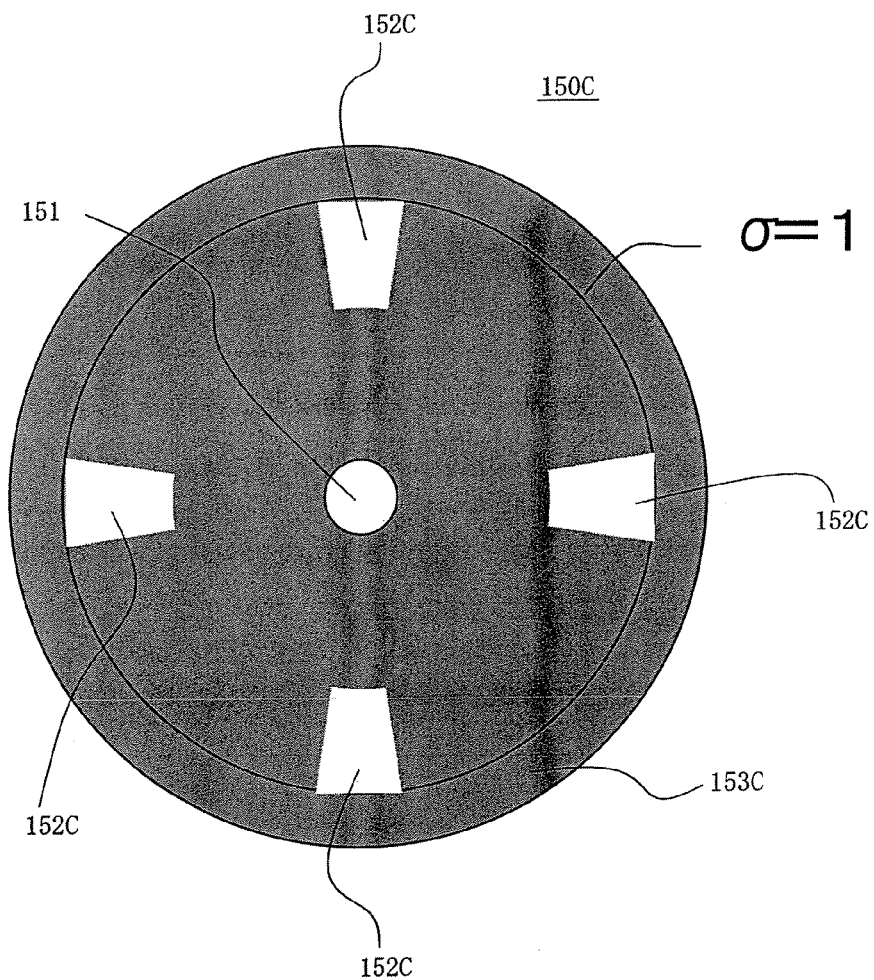
FIG. 4 is a schematic plan view showing still another exemplary shape of an aperture stop shown in FIG. 1.

For example, the circle 152A may be replaced with a rectangle 152B shown in FIG. 3, or a sector 152C shown in FIG. 4. Here, FIGS. 3 and 4 are schematic plan views of aperture stops 150B and 150C as a quintuple-pole illumination stop, as variations of the aperture stop 150A. The aperture 150B includes light transmitting parts with transmittance of 1, composed of a circle 151 and rectangles 152B, and light shielding parts 153b with transmittance of 0. The rectangle 152B is, for example, a square with the length of one side equal to the diameter of a circle 151. The aperture stop 150C includes light transmitting parts with transmittance of 1, composed of a circle 151 and sector 152C forms, and light shielding parts 153C with transmittance of 0. The dimension of the sector 152C can be adjusted arbitrarily. The function of the aperture stop 150B and 150C is the same as the aperture stop 150A, and thus a detailed description thereof will be omitted.

Figure 5:
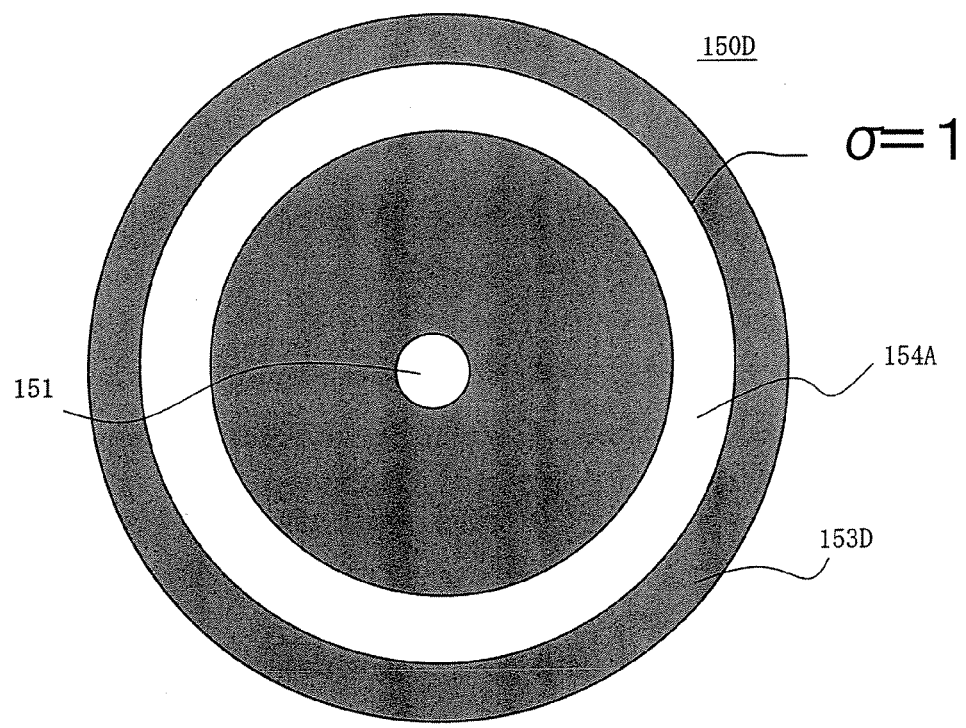
FIG. 5 is a schematic plan view showing still another exemplary shape of an aperture stop shown in FIG. 1.

The aperture stop 150 may use an aperture stop 150D shown in FIG. 5. The aperture stop 150D has an annular aperture 154A in place of a quadrupole. Here, FIG. 5 is a schematic plan view of an aperture stop 150D as an annular illumination stop. The aperture stop 150D comprises light transmitting parts with transmittance of 1, composed of a circle 151 and an annular 154A, and light shielding parts 153D with transmittance of 0. The functions of these stops are the same as the aperture stop 150A, and thus a detailed description thereof will be omitted.

Figure 6:
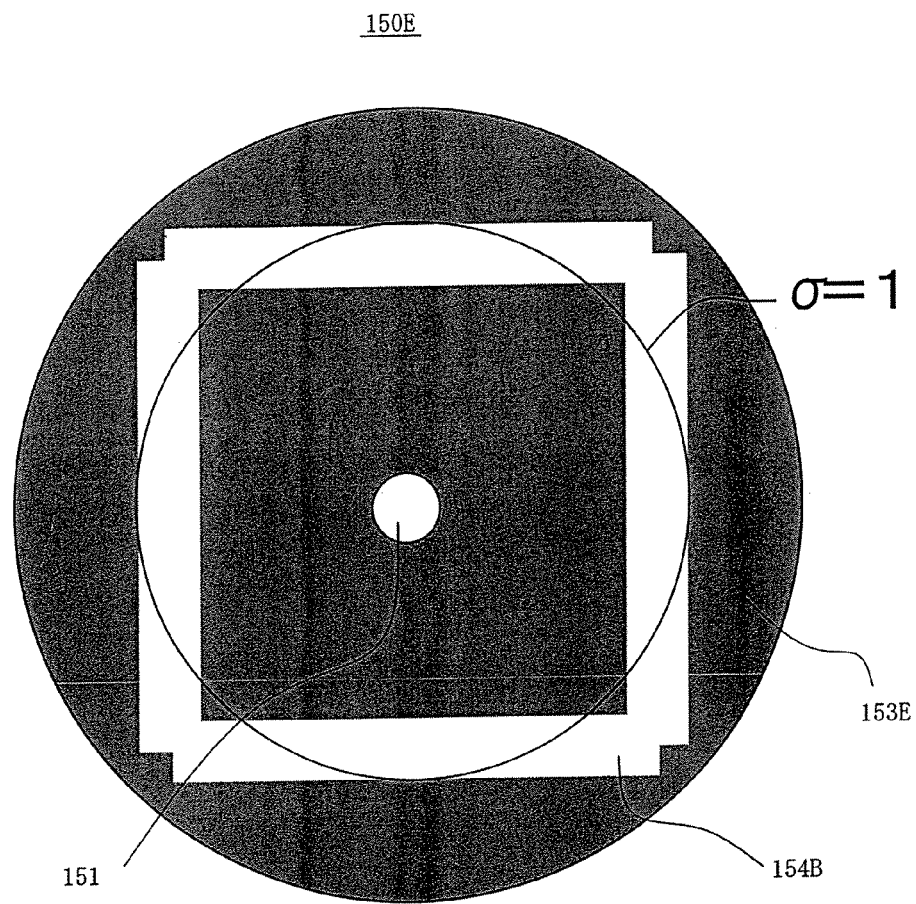
FIG. 6 is a schematic plan view showing still another exemplary shape of an aperture stop shown in FIG. 1.
Figure 7:
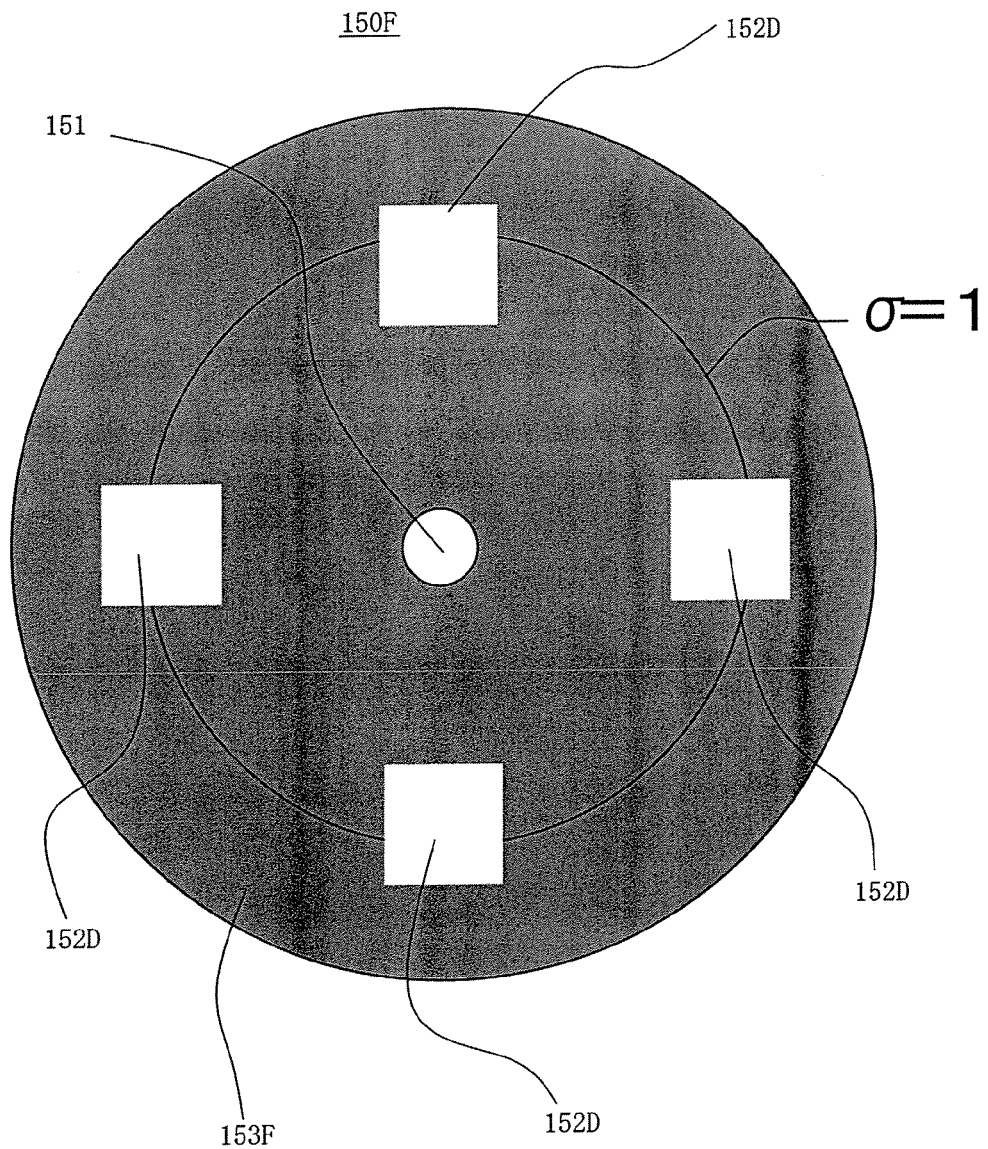
FIG. 7 is a schematic plan view showing still another exemplary shape of an aperture stop shown in FIG. 1.

The aperture stop 150 may use the aperture stops 150E and 150F, respectively, shown in FIGS. 6 and 7. The aperture stops 150E and 150F have the light transmitting sections 154B and 152D wherein σ partially exceeds 1. The present inventors have discovered that if illumination light whose σ partially exceeds 1 is used, a pattern image to be formed on the plate 400 becomes clear. Here, FIG. 6 and FIG. 7 are plan views of the aperture stop 150E as an annular illumination stop and of the aperture stop 150F as a quadrupole illumination stop. The aperture stop 150E has light transmitting parts with transmittance of 1, composed of the circle 151 and an annular (or a rectangular-belt) 154B partially exceeding σ=1, and light shielding parts 153E with transmittance of 0, and the aperture stop 150F has light transmitting parts with transmittance of 1, composed of the circle 151 and a rectangle 152D partially exceeding σ=1, and light shielding parts 153E with transmittance of 0. The functions of them are the same as the aperture stop 150A, and thus a detailed description thereof will be omitted.

The stop aperture 150 of the instant embodiment has an aperture shape for illuminating the mask 200 by using first illumination light and second illumination light. The first illumination light enables two diffracted beams among diffracted beams generated by the mask 200 to enter the pupil plane 320 in the projection optical system 300. The second illumination light enables at least one diffracted beam to enter an area on the pupil plane 320 in the projection optical system 300, which area does not shield the first illumination light (and excludes an area representative of two diffracted light positions on the pupil plane 320 by straight lines). The instant embodiment may (1) prepare two aperture stops, one of which provides illumination light which enables two diffracted beams to enter pupil plane 320 in the projection optical system 300 and the other of which provides illumination light which enables at least one diffracted beam to enter an area that is located on the pupil plane 320 in the projection optical system 300 but does not shield the illumination light providing two incident diffracted beams, and (2) use these aperture stops one-by-one to illuminate the mask 200. One of characteristics of the present invention is to solve problems that associate with an exchange of the mask 200. So long as the mask 200 is not exchanged, there will be no problem as to exchanging the aperture stop 150.

The (first) illumination light that enables two beams corresponding to an effective light source that enter the pupil plane 320 in the projection optical system 300 results in an interference between two beams of ±1st order diffracted beams for a phase shift mask 200A, which will be described with reference to FIG. 9, and 0-th order diffracted beam and +1st or −1st order diffracted beam for a binary mask 200, which will be described with reference to FIG. 8. On the other hand, the illumination light that enables at least one diffracted beam corresponding to the effective light source to enter an area on the pupil plane 320, which area does not shield the first illumination light, highlights, on the plate 400, an exposure amount of a contact hole pattern through the first illumination light, corresponding to contact holes 210.

Figure 21:
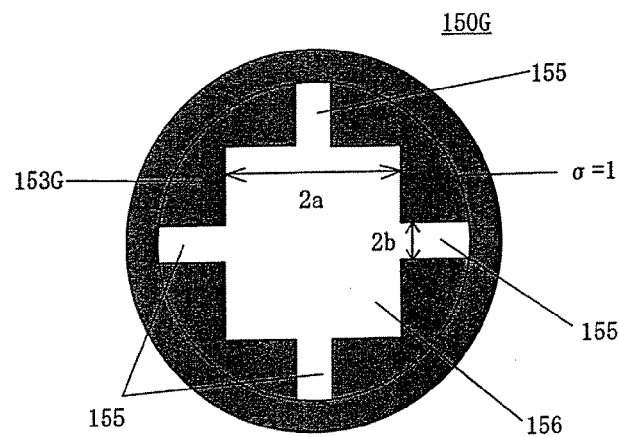
FIG. 21 is a schematic plane view showing an exemplary shape of an aperture stop.

Referring now to FIGS. 21–24, a description will be given of exemplary shapes applicable to the aperture stop 150. Here, FIGS. 21–24 are schematic plane views of exemplary shapes applicable to the aperture stop 150. FIG. 21 is a schematic plane view of the aperture stop 150G as a modified-illumination stop having a rectangular effective light source at its center having crossed illumination. The aperture stop 150G has four rectangles 155, and one rectangle 156 at its center. The four rectangles 155 are formed in a radially longitudinal direction (with a crossed shape) at angles of 0°, 90°, 180°, and 270°. The aperture stop 150G includes a light transmitting part having transmittance of 1, which includes rectangles 155 and 156, and a light blocking or shielding part 153G having transmittance of 0.

Here, a circle of σ=1, as shown, corresponds to an (circular) outline of an image of an aperture in the aperture stop 150 when the stop 150 in the projection optical system 300 is projected, in a reverse direction, onto each stop for illumination. Therefore, it may be said that an aperture in a stop shown in each figure in this application is an effective light source to be projected upon an aperture (σ=1) in the aperture stop in the projection optical system.

The rectangles 155 are positioned so that each of four rectangles 155 is subject to the oblique incidence illumination, whereby two diffracted beams (or ±1st order diffracted beams) enter the pupil plane 320 in the projection optical system 300 and form interference fringes on the plate 400. On the other hand, the rectangle 156 provides illumination light that enables at least one beam to enter an area on the pupil plane 320 in the projection optical system 300 and the area does not shield the first illumination light, highlighting the desired pattern of contact holes while restraining the dummy resolution pattern.

There are various modifications regarding illumination that enable at least one beam to enter an area on the pupil plane 320 in the projection optical system 300 and the area does not shield the first illumination light. For example, the rectangle 156 may be replaced with another arbitrary figure.

Figure 22:
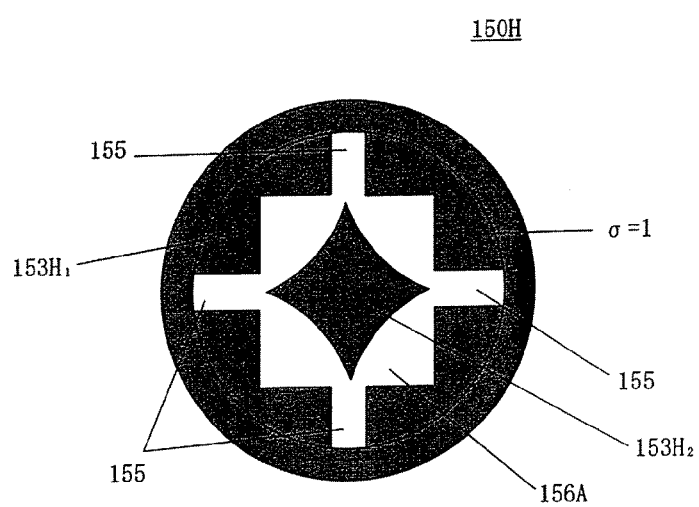
FIG. 22 is a schematic plane view showing an exemplary shape of an aperture stop.
Figure 23:
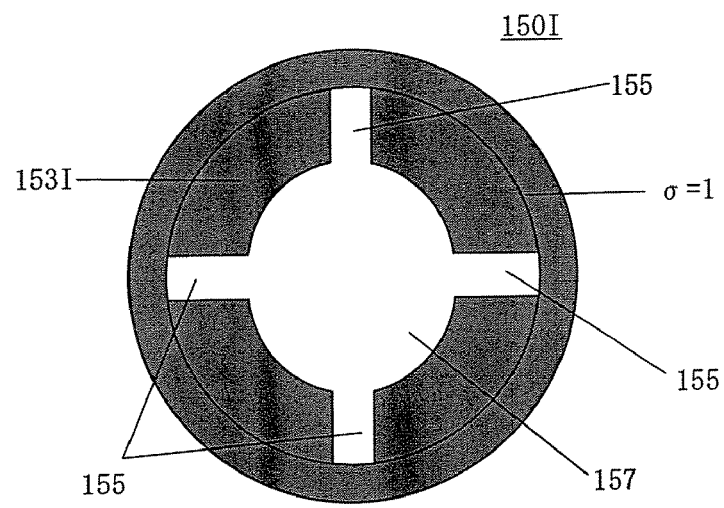
FIG. 23 is a schematic plane view showing an exemplary shape of an aperture stop.

For example, the rectangle 156 may be replaced with a rectangle 156A having a light shielding part $153H_2$ as shown in FIG. 22, or a circle 157 shown in FIG. 23. Here, FIGS. 22 and 23 are schematic plane views of the aperture stops 150H and 150I as modifications of the aperture stop 150G. The aperture stop 150H has a light transmitting part having transmittance of 1, which includes a rectangle 156A having the above four rectangles 155 and a light blocking part $153H_2$ at its center, and light blocking parts $153H_1$ and $153H_2$ of transmittance of 0. The rectangle 156A has an approximately rhomb shape at the center of the rectangle 156 in order to strictly define an area which only one diffracted beam enters pupil plane 320. The aperture stop 150I has a light transmitting part of transmittance 1 including the above four rectangles 155 and circle 157, and a light blocking part 153I of transmittance 0. The aperture stop 150I has an effective light source as an area which only one diffracted beam enters the pupil plane 320, and has a shape of circle 157 that inscribes the rectangle 156. The aperture stops 150H and 150I serve similar to the aperture stop 150G, and thus a description thereof will be omitted.

Figure 24A:
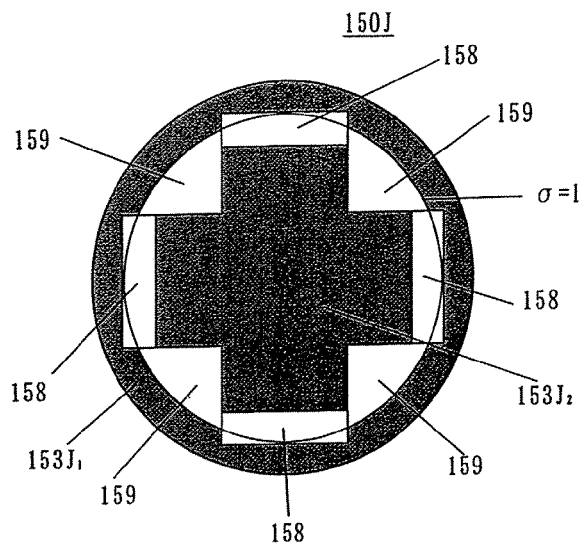
FIG. 24 is a schematic plane view showing an exemplary shape of an aperture stop.
Figure 24B:
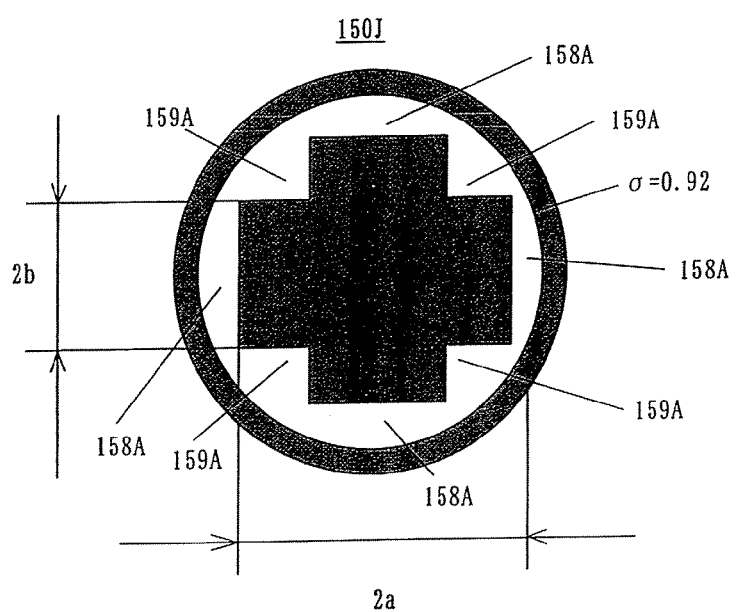

FIG. 24 is a schematic plane view of the aperture stop 150J, applied to the binary mask 200 which will be described with reference to FIG. 8, as a modified-illumination stop providing an effective light source distribution that has a light blocking portion of a cross shape (non-circular aperture shape) at its center. The aperture stop 150J in FIG. 24A arranges four rectangles 158 (in a cross shape) at angles of 0°, 90°, 180° and 270° in a longitudinal direction orthogonal to the radial direction, and sectors 159 (in a cross shape) at angles 0°, 90°, 180° and 270° inclining them by 45° from the rectangles 158. The aperture stop 150J has a light transmitting part of transmittance of 1, which includes the rectangles 158 and sectors 159, and a light blocking apart $153J_1$ located at an outer circumference and a light blocking part $153J_2$ having a crossed shape at its center, each having transmittance of 0. Although the rectangles 158 and sectors 159 are referred to as independent light transmitting parts herein, they are usually formed as one continuous light transmitting part. The inventive stop is shown in FIG. 24B as one preferred example.

The rectangles 158 are positioned so that each of four rectangles 158 is subject to the oblique incidence illumination, whereby two diffracted beams (of 0-th order diffracted beam and one of ±1st order diffracted beams) enter the pupil plane 320 in the projection optical system 300 and form interference fringes on the plate 400. On the other hand, the sectors 159 provides illumination light that enables at least one beam to enter an area on the pupil plane 320 in the projection optical system 300 and the area does not shield the first illumination light, highlighting the desired pattern of contact holes while restraining the dummy resolution pattern.

The aforementioned aperture stops 150A–150J are characterized in producing an effective light source that reaches σ=1. According to the instant inventors' review, it is preferable that the outermost off-axial portion of the effective light source is located in an area of σ>0.9. For example, the effective light source in the stop 150J shown in FIG. 24B is dimensioned such that a diameter of an outer circle corresponds to σ=0.92. The outer circle preferably has a diameter that is located in such a range as 0.9<σ<1.

Figure 18:
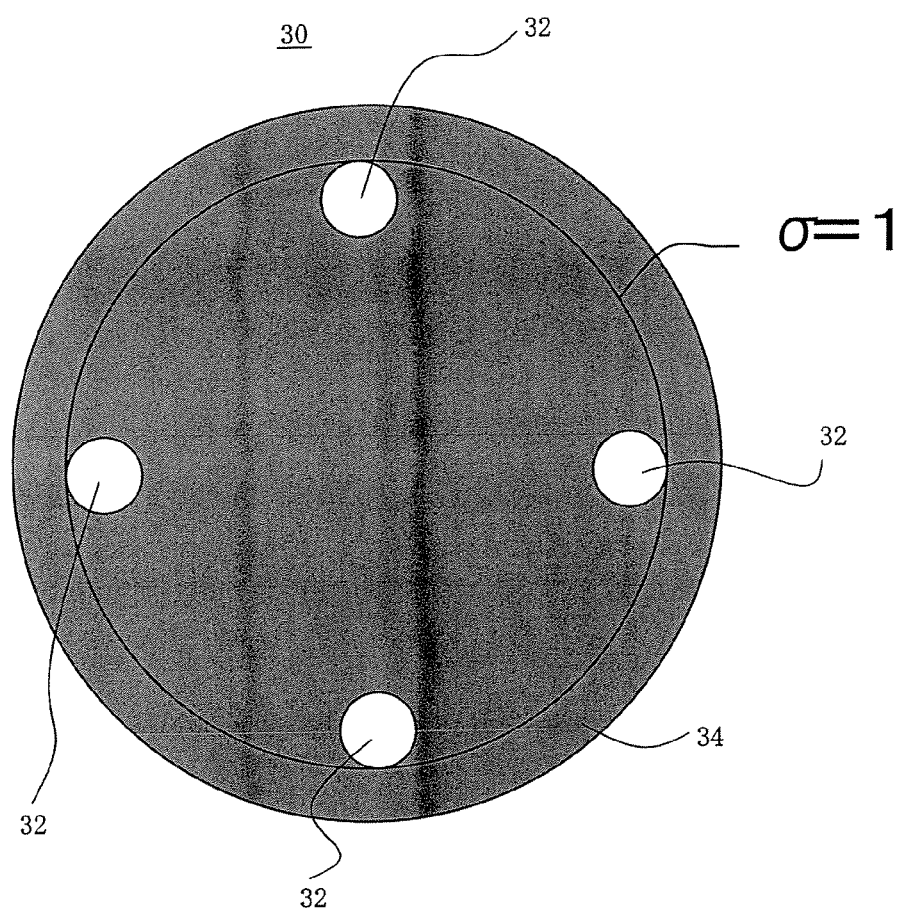
FIG. 18 is a schematic plan view of a crossed (quadrupole) illumination stop for illuminating the mask shown in FIG. 16.

For a selection of a desired aperture stop 150 from multiple kinds of aperture stops 150, aperture stops 150A–150J may be arranged, for example, on a disc turret (not shown), and the turret is turned when the aperture stop is to be switched. Such a turret may mount an aperture stop having a circular aperture that provides only illumination light having its peak near the optical axis, and an aperture stop providing only illumination light having its peak off the axis (as shown in FIG. 18). Consequently, the illumination apparatus 120 may use, as illumination light for the mask 200, either one of illumination light having its peak near the optical axis and illumination light having its peak off the axis to illuminate the mask 200, and then use the other light to illuminate the mask 200. In using the illumination light created by combining the illumination light having its peak on the optical axis and the illumination light having its peak off the axis, the exposure-amount regulator 132 may change a ratio of exposure light volume.

Similarly, the turret may be equipped with an aperture stop having such an aperture as crossed four rectangles 155 and rectangle 158 for providing illumination light that enables two diffracted beams to enter pupil plane 320 in the projection optical system 300, or an aperture stop having such an aperture as rectangle 156 (rectangle 156A, or circle 157) and four sectors 159 for providing illumination light that enables one diffracted beam to enter pupil plane 320. Consequently, the illumination apparatus 120 may use, as illumination light for the mask 200, either one of illumination light that enables two diffracted beams to enter the pupil plane 320 in the projection optical system 300 and illumination light that enables one diffracted light to enter the pupil plane 320, and then use the other light to illuminate the mask 200. In using the illumination light created by combining the both illumination light, the exposure-amount regulator 132 may change respective a ratio of exposure light volume.

The condenser lens 160 condenses as many rays of light exited from the fly-eye lens 140 as possible, and Koehler-illuminates the mask 200 so that the chief rays may become parallel, i.e., telecentric. The mask 200 and the plane of exit 140b of the fly-eye lens 140 are disposed in the Fourier transformation relationship.

A prism member or the like which has a light deflecting surface for forming a beam whose light volume distribution is similar to an aperture (or effective light source) of one of the aforementioned aperture stops 150a–150J may be used singularly or in combination with one of the above aperture stops. Such a prism member may be supplied, for example, between the light source and the fly-eye lens 140 so as to form the above light volume distribution at a light incident source of the fly-eye lens 140.

The exposure apparatus may have, if needed, a width-variable slit for controlling uneven illumination or a masking blade (a stop or a slit) for regulating the exposure area during a scan. If a masking blade is provided, the masking blade and the plane of exit 140b of the fly-eye lens 140 are disposed in the Fourier transformation relationship, and placed in an optically approximately conjugate position to the plane of the mask 200. Beams that have transmitted an opening section of the masking blade are used as the illumination light for the mask 200. The masking blade is a stop having an automatically variable opening width, thus making vertically changeable the transfer area (of the opening slit) for the plate 400, which will be described later. The exposure apparatus may further have a scan blade, with a structure similar to the above masking blade, which makes horizontally changeable the transfer area (as one shot scan exposure area) for the plate 400. The scan blade is also a stop having an automatically variable opening width, and is installed at an optically approximately conjugate position. Thus, the exposure apparatus can use these two variable blades to set the dimensions of the transfer area in accordance with the dimensions of an exposure shot.

The mask 200 is, e.g., of quartz, on which a circuit pattern (or an image) to be transferred is created, and is supported and driven by a mask stage (not shown). Diffracted light emitted from the mask 200 passes the projection optical system 300, and then is projected onto the plate 400. The plate 400 is an object to be exposed, onto which resist is applied. The mask 200 and the plate 400 are located in an optically conjugate relationship. The exposure apparatus in this embodiment is a step-and-scan type exposure apparatus (namely, a scanner), and therefore, scans the mask 200 and the plate 400 to transfer a pattern on the mask 200 onto the plate 400. When it is a step-and-repeat type exposure apparatus (i.e., "a stepper"), the mask 200 and the plate 400 are kept stationary for exposure.

The mask stage supports the mask 200, being connected to a transport mechanism (not shown). The mask stage and the projection optical system 300 are installed on a stage body tube surface plate supported via a damper, for example, to the base-frame placed on the floor. The mask stage can use any structure known in the art. The transport mechanism (not shown) is made up of a linear motor and the like, and drives the mask stage in X-Y directions, thus moving the mask 200. The exposure apparatus scans the mask 200 and the plate 400 in a state synchronized by a control mechanism (not shown).

The mask 200 as one aspect of the present invention forms two-dimensionally arranged contact pattern holes, and has made a contact hole diameter at a desired position larger than other contact hole diameters.

Figure 14:
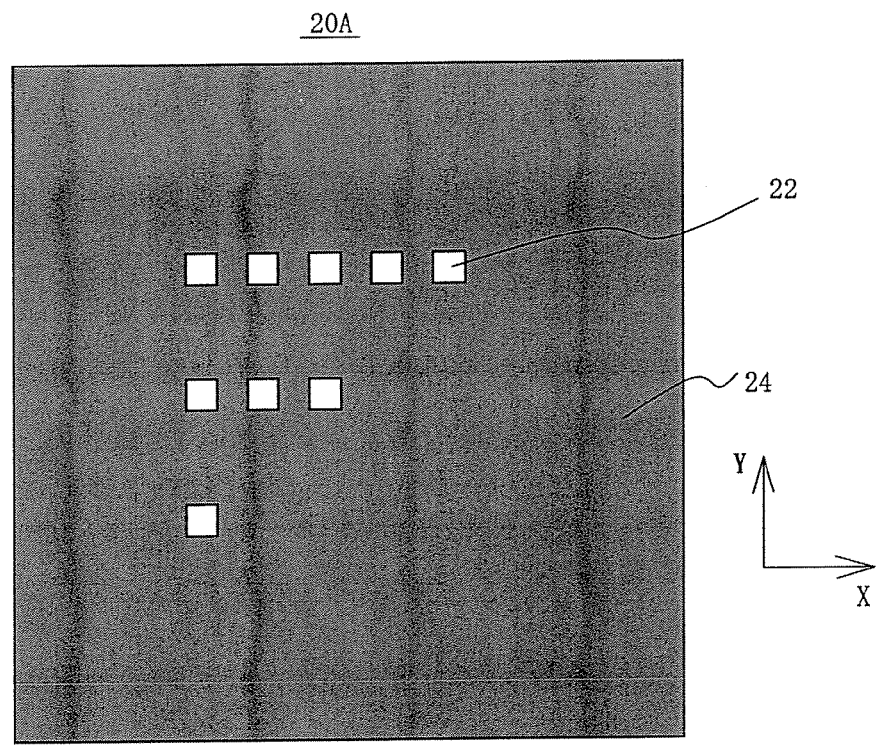
FIG. 14 is a plan view of a binary mask that has formed a desired pattern of contact holes.

To describe a pattern structure on the mask 200 of the present invention, a description will now be given of a desired pattern of contact holes. Now, it is assumed that the desired pattern of contact holes be, for example, like a pattern shown in FIG. 14. Here, FIG. 14 is a schematic plan view of a binary mask 20A that forms the desired pattern of contact holes. The binary mask 20A has light transmitting parts 22 with transmittance of 1 and light shielding parts 24A with transmittance of 0, where the phase of each light transmitting section 22 is equal. The contact holes 22 are, provided a hole diameter is P, horizontally (i.e., in a direction X) lined up with a pitch Px=2P, and vertically (i.e., in a direction Y) lined up with a pitch Py=4P, thus forming two-dimensional lines of contact holes. Now, it is assumed that a contact hole 22 has a hole diameter of about 0.15 μm or less, e.g., 0.12 μm. Now, it is assumed that the projection optical system 300, which will be described later, uses KrF (with a wavelength of 248 nm) and NA of 0.60. In this case, the factor $k_1$ in the above equation is 0.29.

Figure 15:
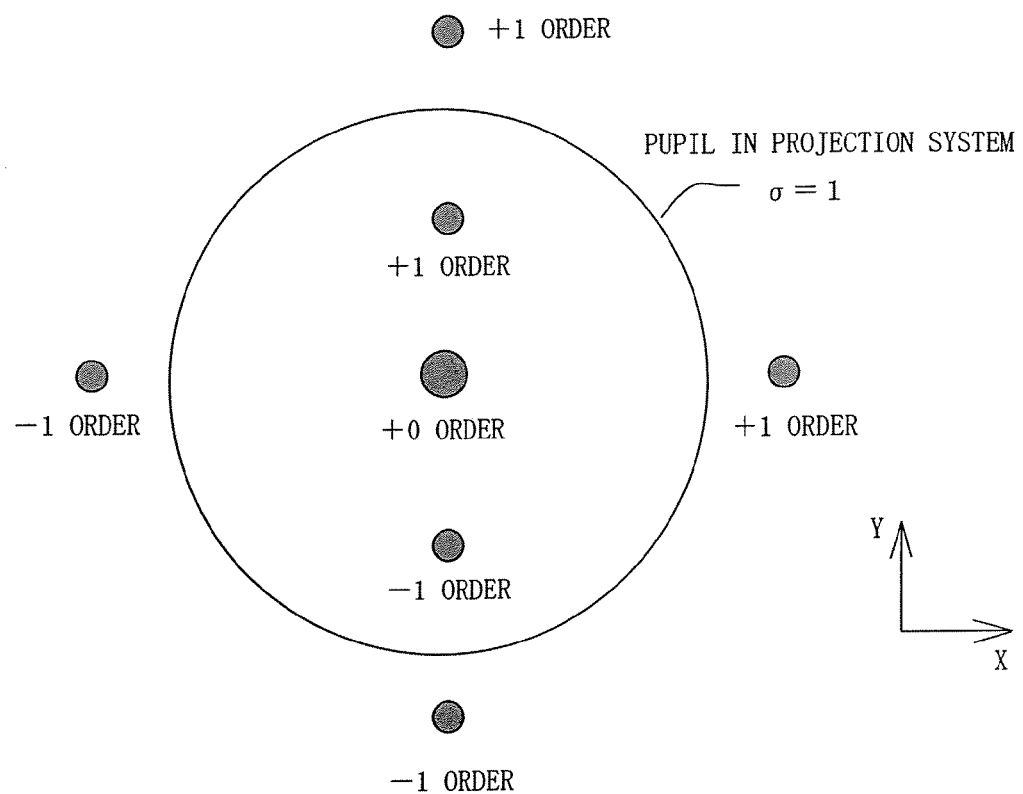
FIG. 15 is a schematic plan view showing a distribution of diffracted light appearing on the pupil plane in the projection optical system in the exposure apparatus when illumination light having its peak near the optical axis is used to illuminate the mask shown in FIG. 14.

FIG. 15 is a schematic plan view showing a distribution of diffracted light appearing on the pupil plane 320 in the projection optical system 300, which will be described later, when the aperture stop 150 uses a stop having only circular apertures 151 (namely, uses perpendicularly incident small σ illumination) to illuminate the mask 20A. If the binary mask 20A is illuminated perpendicularly by use of small σ illumination, there arise, as mentioned above, 0-th order and ±1st order diffracted beams. Since the contact holes 22 have a very fine hole diameter, and are lined up in the direction X at a pitch $P_0$ twice as much as the hole diameter, only the 0-th order diffracted beam reaches the pupil 320 in the direction X in FIG. 15, and the ±1st order diffracted beams miss the pupil 320, thus no pattern being formed on the exposed plane (or the plate 400). On the other hand, the contact holes 22 are lined up in the direction Y at a pitch Py four times as much as the hole diameter P, and thus the ±1st order diffracted beams corresponding to this pitch $P_1$ reach the pupil 320. Nevertheless, all diffracted light corresponding to the hole diameter P deviates from the pupil 320, and thus no desired pattern is formed. Use of the illumination light having its peak off the axis would bring diffracted light in the pupil in the projection optical system and enable an image to be somehow formed. Nevertheless, that alone cannot provide the good image shape, or improve the image-forming characteristics in the depth of focus.

Figure 16:
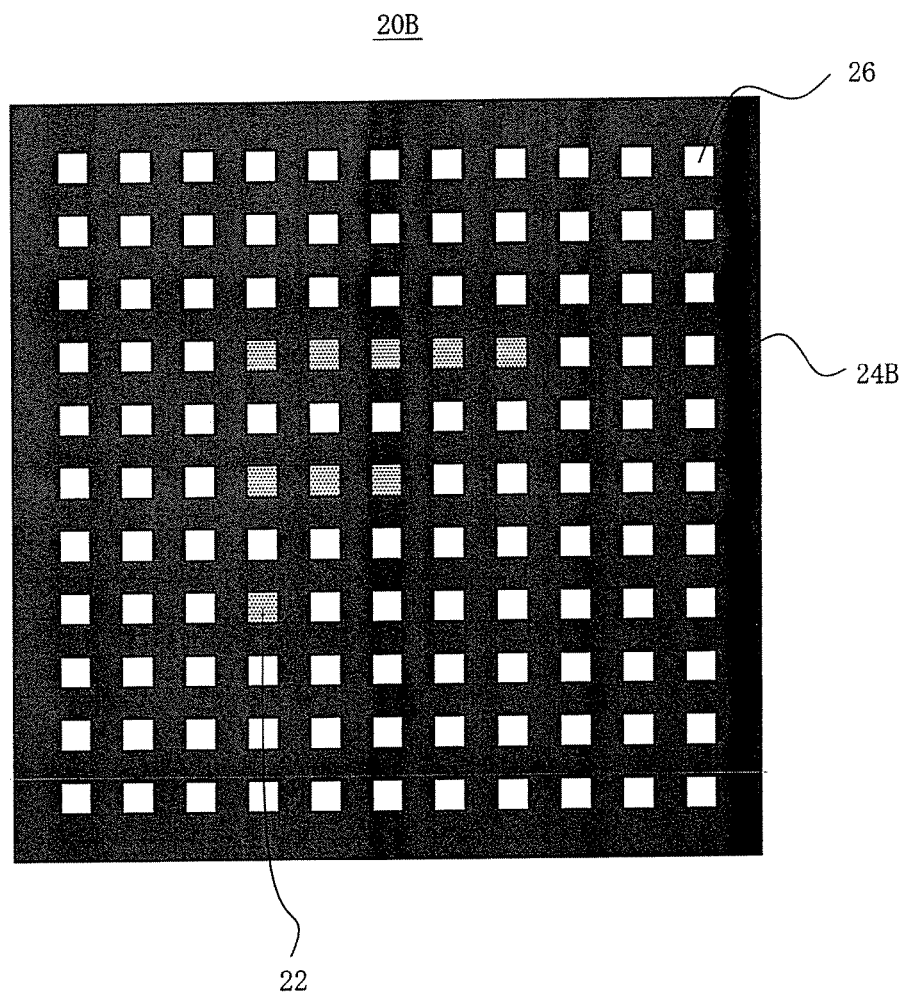
FIG. 16 is a schematic plan view of a mask having a contact hole pattern which two-dimensionally arranges the pattern shown in FIG. 14 and a dummy pattern of contact holes.

Accordingly, a binary mask 20B has been prepared, as shown in FIG. 16, by adding dummy contact holes 26 whose hole diameter is the same as that of the desired contact hole 22 to the desired contact holes 22 shown in FIG. 14, so that a contact hole pattern two-dimensionally arranges a desired pattern of contact holes 22 and a dummy pattern of contact holes 26. Here, FIG. 16 is a schematic plan view of the mask 20B. The binary mask 20B has light transmitting parts with transmittance of 1, composed of the contact holes 22 and 26, and light shielding parts 24B with transmittance of 0. The phase of each light transmitting section is equally set to be 0°.

Figure 17A:
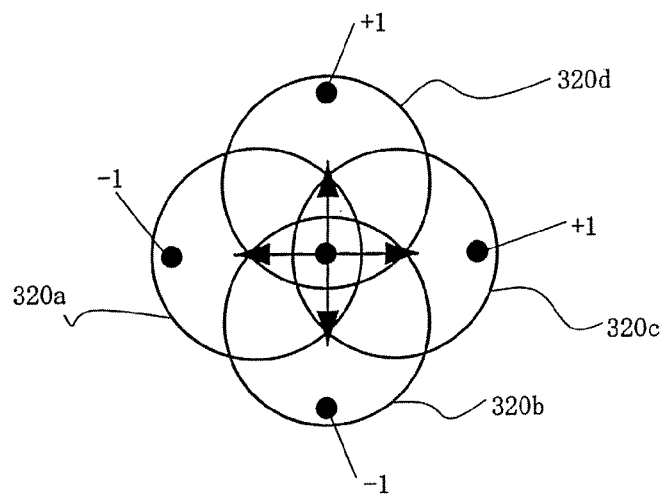
FIG. 17 is a schematic view for explaining a distribution of diffracted light appearing on the pupil plane in the projection optical system in the exposure apparatus when crossed (quadrupole) illumination light is used to illustrate the mask shown in FIG. 14.

FIG. 17A is a schematic plan view for explaining a distribution of diffracted light appearing on the pupil 320 in the projection optical system 300, which will be described later, by using a crossed (quadrupole) illumination stop 15 shown in FIG. 18 having four circular apertures 32 as the aperture stop 150, (namely, by oblique incidence illumination light having its peak off the optical axis) to illuminate the mask 20B. Here, FIG. 18 is a schematic plan view of a crossed (quadrupole) illumination stop 30. The stop 30 corresponds to the stop 150A which removes the center circle 151, and thus has light transmitting parts with transmittance of 1, composed of four circles 32 same as four circles 152.

Figure 17B:
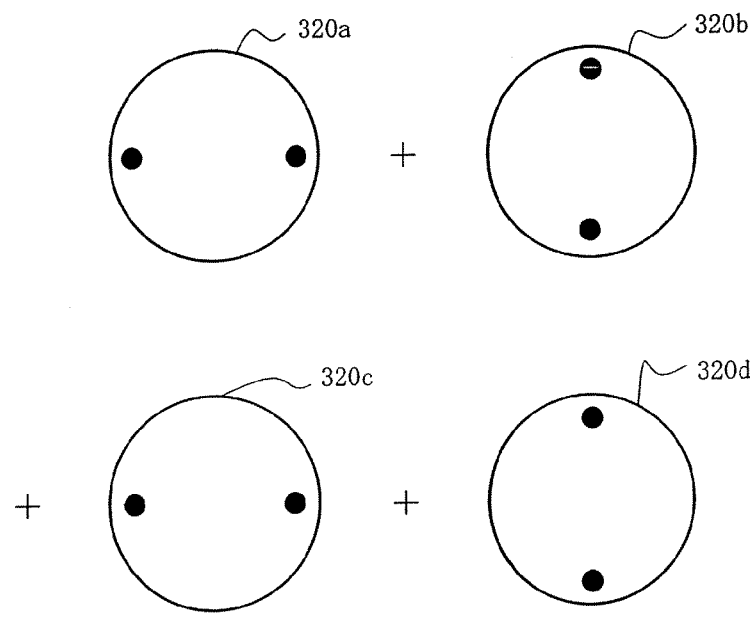
Figure 35:
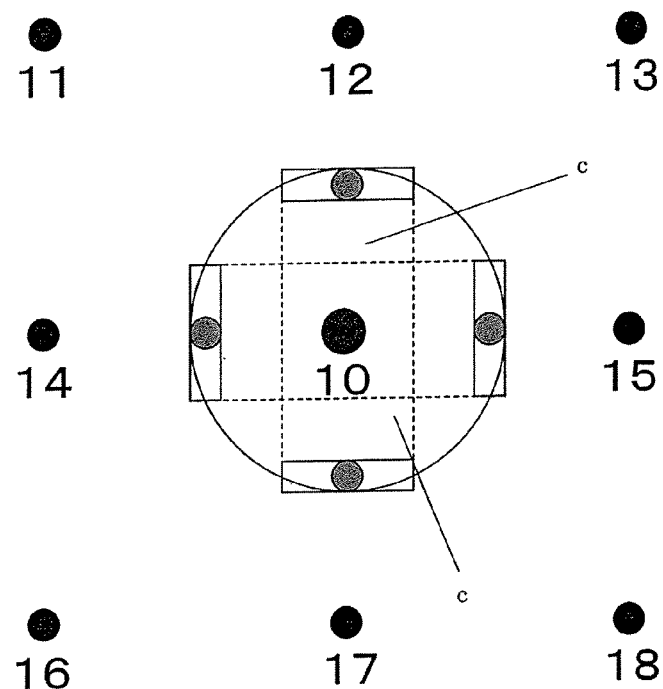
FIG. 35 is a typical view showing a position of a diffracted beam on a pupil plane for small σ illumination onto the binary mask shown in FIG. 8 and, a diffracted-beam moving position for oblique incidence illumination.

FIGS. 17A and 17B show that if perpendicular illumination light is changed to crossed illumination light, it changes from a state shown in FIG. 15 to that shown in FIG. 35. This will be understood from the fact that in FIG. 15, for example, the right +1st order diffracted beams (in the direction X) move to the left by the oblique incidence illumination, and the 0-th order diffracted beam enters the left side of the pupil 320 and the +1st order diffracted beams enters the right side of the pupil (corresponding to 320c shown in FIG. 17A).

When the small σ illumination light perpendicularly illuminates the binary mask 20B, there arise the 0-th order diffracted beam and the +1st or −1st order diffracted beam as mentioned above. The 0-th order diffracted beam and +1st or −1st order diffracted beam enter the pupil plane 320a and 320d by obliquely entering in four directions via four apertures 32. FIG. 17B shows that this forms the light intensity distribution of the pupil plane 320. Although the illumination light having its peak off the optical axis may expose fine contact hole pattern shown in FIG. 16, it is understood that this state transfers not only the desired pattern of contact holes 22 but also the dummy pattern of contact holes onto the plate 400.

A description will now be given of the mask 200 of the instant embodiment with reference to FIG. 8. Here, FIG. 8 is a schematic plan view of the mask 200. When the mask 200 makes larger hole diameters of only the desired contact holes 22 in the mask 20B. As shown in FIG. 8, the mask 200 has the contact pattern that two-dimensionally arranges the desired pattern of contact holes 210 and dummy patterns of contact holes 220. The mask 200 is a binary mask that has light transmitting parts with transmittance of 1, composed of contact holes 210 and 220, and light shielding parts with transmittance of 0. In addition, the phase of each light transmitting part is equally set to be 0°. A desired contact hole 210 has a hole diameter 25% larger than that of a dummy contact hole 220, and thus increases an exposure light volume.

In addition, the instant embodiment uses the aperture stop 150 (150A–150F) to expose the mask 200 by applying illumination light combining illumination light having its peak near the optical axis and illumination light having its peak off the axis. The illumination light having its peak off the axis when used to illuminate the mask 200 would provide, on the plate 400, an intensity distribution having highlighted contrast of periodic contact hole pattern. The illumination light having its peak near the optical axis when used to illuminate the mask 200 would provide, on the plate 400, an intensity distribution of an aperiodic pattern having a highlighted desired pattern of contact holes 22. In addition, another embodiment of the present invention exposes the mask 200 using the aperture stops 150G–150J, first illumination light and second illumination light. The first illumination light enables two diffracted beams among diffracted beams generated by the mask 200 to enter the pupil plane 320 in the projection optical system 300. The second illumination light enables at least one diffracted beam to enter an area on the pupil plane 320 in the projection optical system 300, which area does not shield the first illumination light. The incidence of two diffracted beams upon the pupil plane 320 causes interference infringes between two beams, providing a surface of the plate 400 with a intensity distribution of a contrast-highlighted and periodic pattern of contact holes. The incidence of one diffracted light upon an area the pupil plane 320, which area does not shield the first illumination light, restraining the dummy resolution pattern generated by the first illumination light and forming an intensity distribution that highlights a desired pattern of contact holes on the plate 400.

As a result, by combining these two kinds of illumination light with each other and appropriately selecting a threshold of the resist on the plate 400, which will be described later, the desired pattern of contact holes 22 can be transferred to the resist on the plate 400 at the first attempt of exposure with high quality (i.e., with uniform shapes of the desired contact holes 22 and with a high image-forming characteristic under fluctuation within the depth of focus).

Figure 9:
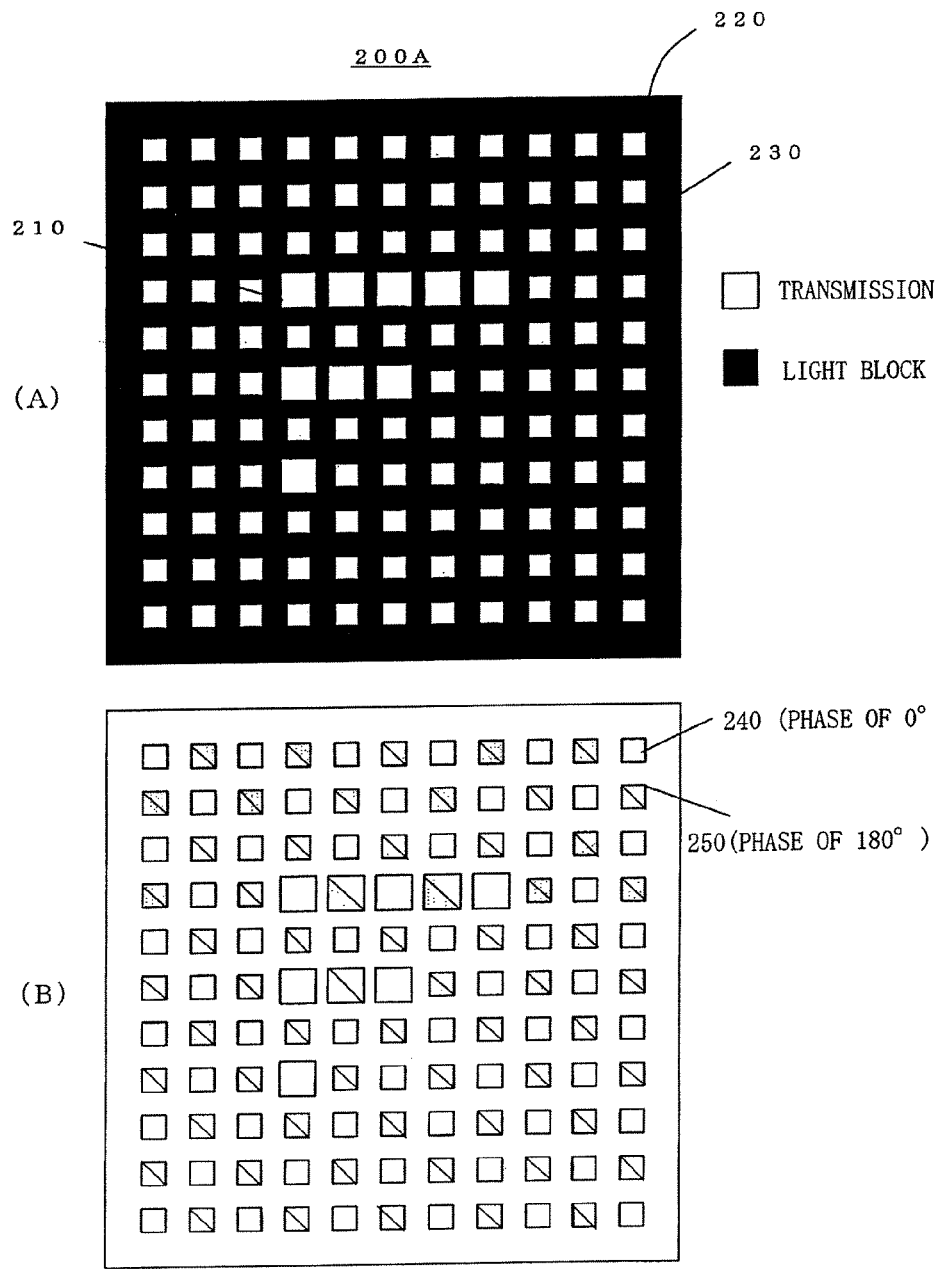
FIG. 9 is a schematic view showing a variation of the mask shown in FIG. 8.

The mask 200 can be replaced with the mask 200A shown in FIG. 9. Here, FIG. 9A is a schematic plan view of the mask 200A, and FIG. 9B is a schematic plan view for explaining a phase status of a light transmitting part in the mask 200A. As shown in FIG. 9A and as in the mask 200, the mask 200A forms a contact hole pattern that two-dimensionally arranges the desired pattern of contact holes 210 and the dummy pattern of contact holes 220. However, the mask 220A differs from the mask 220 in that it is a phase shift mask. Thus, as shown in FIG. 9B, the contact hole pattern in the mask 200A checkwise sets phases of 0° and 180° to adjacent contact holes 240 and 250. The phase shift mask, when used, would cancel out the 0-th order diffracted beam that has passes adjacent light transmitting parts, and the ±1st order diffracted beams contribute to image formation. The equal light intensity of ±1st order diffracted beams enhance the pattern contrast obtained as an interference fringe in comparison with use of the 0-th order diffracted beam and +1st or −1st order diffracted beam, and thus forming a satisfactory pattern onto the plate 400.

Figure 12:
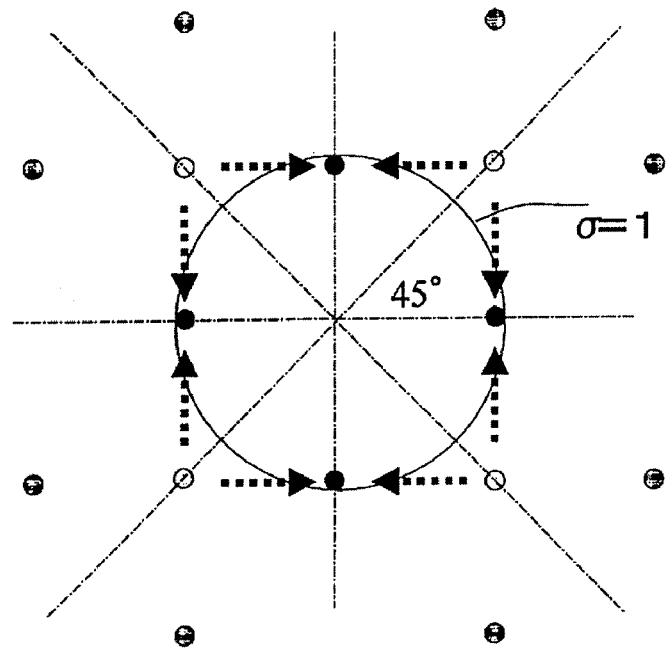
FIG. 12 is a schematic plan view showing a distribution of diffracted light appearing on a pupil plane in a projection optical system for illumination light having its peak off the optical axis when the aperture stop shown in FIG. 2 is used to illuminate the mask shown in FIG. 11.

Referring to FIG. 12, a more detailed description will be given of diffraction with the phase shift mask 200A. Here, FIG. 12 is a distribution of diffracted light appearing on the pupil plane 320 due to illumination light having its peak off the axis when the aperture stop 150A is used to illuminate the phase shift mask 200A.

For crossed perpendicular incidence, all the diffracted light deviates from the pupil plane 320, as shown in FIG. 12, and no image is formed. However, the crossed obliquely incidence illumination light would shift a position of each diffracted beam on the pupil plane 320 in an arrow direction, to a position indicated by a black circle. The horizontal intense distribution due to two vertical diffracted beams' interference fringe and the vertical intense distribution due to two horizontal diffracted beams' interference fringe on the pupil plane 320 overlay on the plate 400, and form a desired pattern of contact holes 210 at the intersection. The larger hole diameter of only the desired contact holes 210 would make larger the light intensity of only the desired contact holes, and form the desired pattern by setting the threshold of the resist so that this part may become an image.

On the other hand, the illumination light having its peak near the optical axis demonstrates an effect to clarify a desired pattern of contact holes when combined with the illumination light having its peak off the axis.

The status shown in FIG. 12 shows the resolution of $1/\sqrt{2}$ since the diffracted light that was originally located at a position of 45° has moved to a position of 1. In other words, a combination between the phase shift mask 200B and the illumination light having its peak off the axis realizes the same resolution as the resolution critical dimension of the L & S pattern, whereas the resolution limit of the contact hole pattern has been up to $\sqrt{2}$ times of the resolution critical dimension of the L & S pattern in the prior art.

Figure 25:
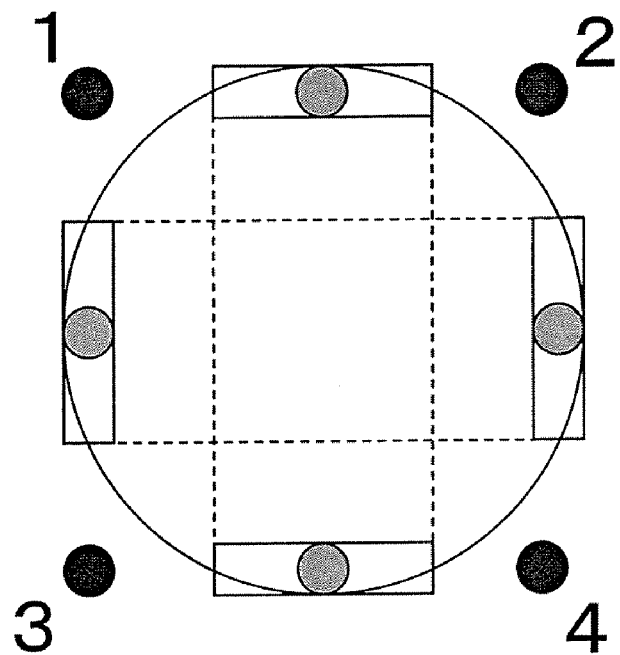
FIG. 25 is a typical view showing a position of a diffracted beam on a pupil plane for small σ illumination onto the phase shift mask shown in FIG. 9 and, a diffracted-beam moving position for oblique incidence illumination.

In case of small σ illumination using the phase shift mask 200A, a diffracted beam deviates from the pupil plane 320 in the projection optical system 300 when a pitch between contact holes is small. Thus, when a pitch between contact holes is small, the diffracted beams moves to positions 1–4 as illustrated by black circle in FIG. 25, and do not form the pattern. Here, FIG. 25 is a typical view showing a position of a diffracted beam on a pupil plane 320 for small σ illumination onto the phase shift mask 200A shown in FIG. 9 and, a diffracted-beam moving position for oblique incidence illumination.

Figure 26A:
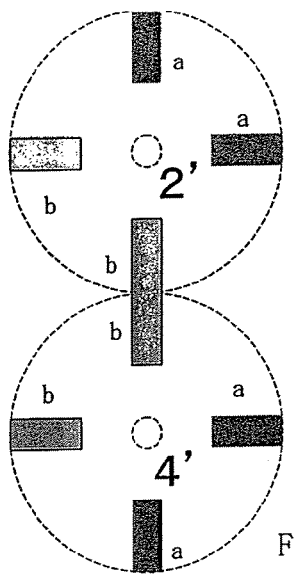
FIG. 26 is a typical view for explaining an effective light source distribution.
Figure 26B:
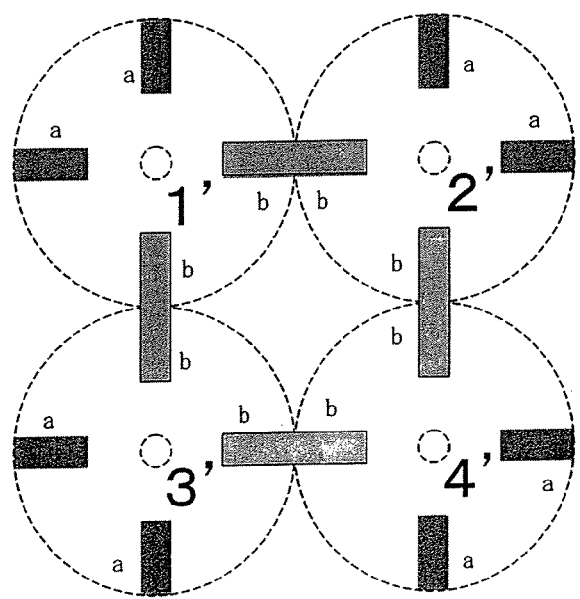
Figure 26C:
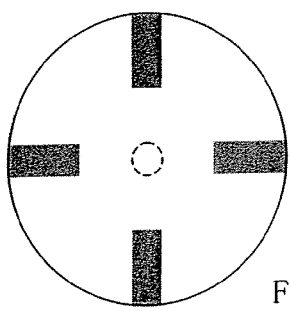

Accordingly, illumination light is required to enables the diffracted beam to enter the pupil. For example, in order for two diffracted beams 2 and 4 to enter an area on the pupil plane 320 shown by a solid-line rectangle in FIG. 25, the oblique incidence illumination is set for an area "a" as a dark rectangle on the effective light source plane in FIG. 26A. Thereby, the diffracted beams labeled by 2' and 4' move to an area "b" as a bright rectangle. The diffracted beams 2 and 4 enter a rectangular area shown by real-line in FIG. 25 and thus enter the pupil. Two diffracted beams enter the pupil with the effective light source shown by one rectangle, and result in interference, forming interference infringes at a regular interval on the plate 400. Four rectangular effective light source areas "a" are combined as shown in FIG. 26B, and linear interference infringes, which has a line shape with a regular pitch in longitudinal and transverse directions, cause part having strong intensity and part having weak intensity to appear two-dimensionally and periodically at intersections of overlapping light intensity on the plate 400. The effective light source has a crossed rectangle distribution that extends in the radial direction as shown in FIG. 26C. Here, FIG. 26 is a typical view for explaining an effective light source distribution.

Figure 27:
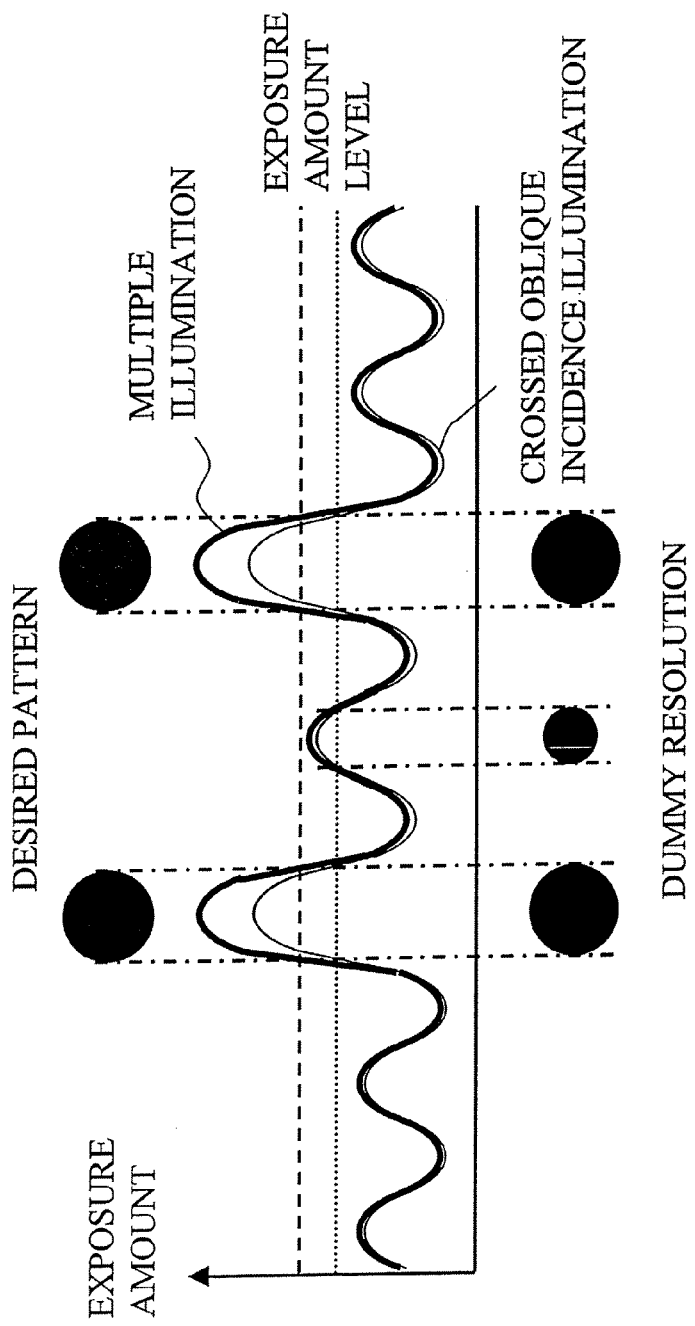
FIG. 27 is a view showing exposure amounts and images corresponding the exposure amounts for the crossed oblique incidence illumination and inventive modified illumination.

As in the phase shift mask 200A, when a hole diameter of a contact hole is made large for a desired pattern on the mask, only the part has larger intensity than peripherals, resolving desired contact holes. However, the crossed oblique incidence illumination (i.e., illumination that enables two diffracted beams to enter a pupil) would provide an exposure amount on the plate 400, as shown by thin solid line in FIG. 27. As a result, the dummy resolution pattern $P_2$ between desired pattern in the exposure amount level for the desired diameter (or threshold for the resist) is suppressed. FIG. 27 is a view showing exposure amounts and images on the plate 400 corresponding the exposure amounts for the crossed oblique incidence illumination and inventive modified illumination.

Figure 28:
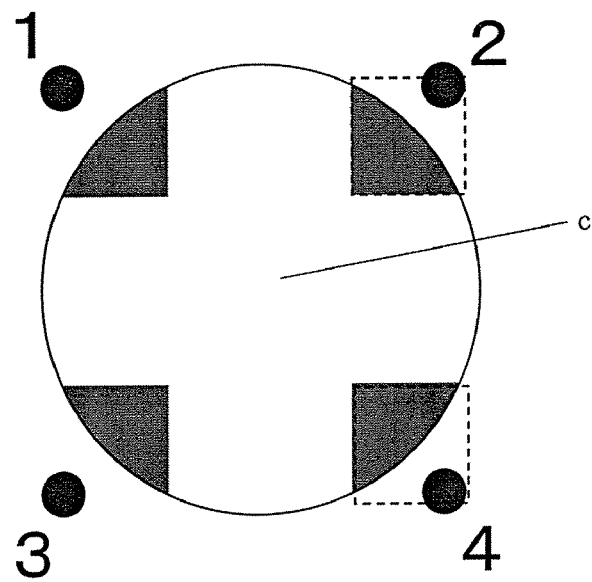
FIG. 28 is a typical view showing a position of an incident diffracted beam on the pupil plane.
Figure 29A:
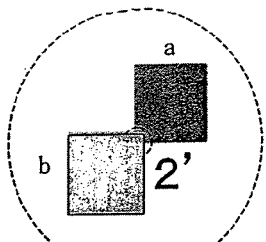
FIG. 29 is a typical view for explaining an effective light source distribution.
Figure 29A:
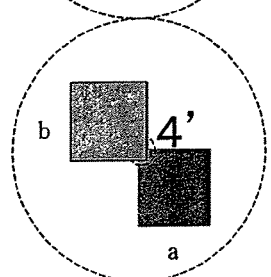
Figure 29B:
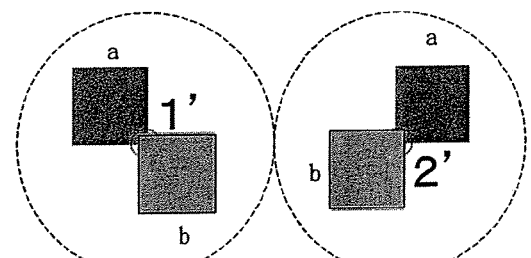
Figure 29B:
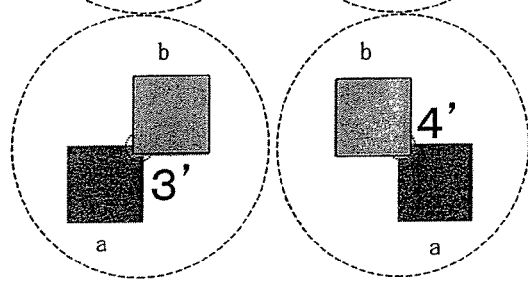
Figure 29C:
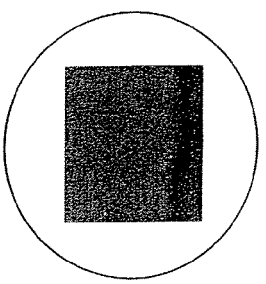

As a result of scrutiny of a method of restraining the dummy resolution, the instant inventors have found, that the dummy resolution may be eliminated, as shown in FIG. 28, by means of an addition of an effective light source distribution that enables only one diffracted beam to enter the pupil plane 320 except an area "c" on the pupil plane as represented by two diffracted light positions using a straight line. Here, FIG. 28 is a typical view showing a position of an incident diffracted beam on the pupil plane 320. Such illumination is achieved, for example, by enabling one diffracted beam 2 or 4 to enter the pupil plane 320 shown as a black sector in FIG. 28, and the illumination may be set as the dark and rectangular area "a" in an effective light source plane in FIG. 29A. As a result, the diffracted beams labeled by 2' or 4' move to the area "b" as a bright rectangle. Since the diffracted beam 2 or 4 enters a rectangular area shown by a solid line including a black sector shown in FIG. 28, the diffracted beam enters the pupil plane 320. Four rectangular effective light source areas "a" are combined as shown in FIG. 29B, and the effective light source distribution at this time form a rectangular effective light source as shown in FIG. 29C. Here, FIG. 29 is a typical view for explaining an effective light source distribution.

Figure 30:
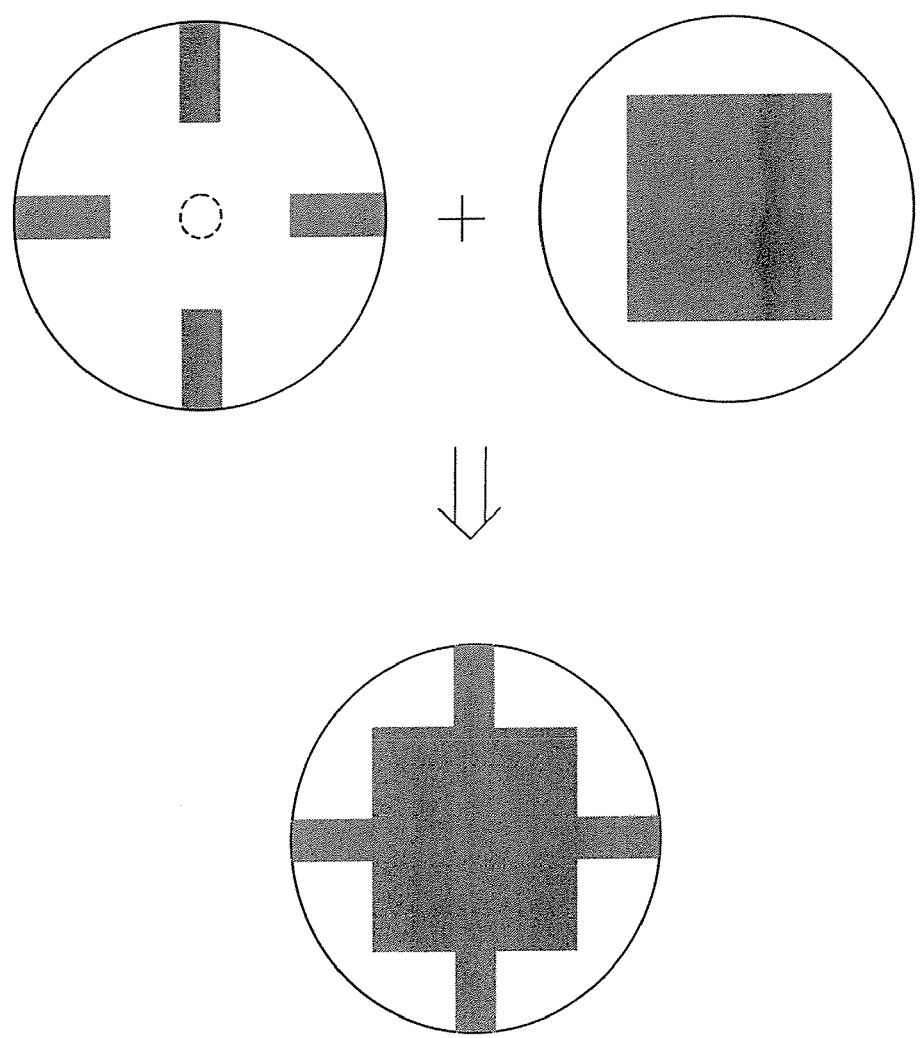
FIG. 30 is a view showing an effective light source distribution.

In this way, the crossed illumination shown in FIG. 30 that adds an effective light source distribution that enables two beams to enter the pupil (see FIG. 26C) and an effective light source distribution that enables one beam to enter the pupil (see FIG. 29C) is modified illumination which has a rectangular effective light source at its central part. The modified illumination having such an effective light source distribution provides an exposure amount on the plate 400 as a solid line. Thereby, only a desired pattern $P_3$ may be obtained while the dummy resolution pattern is eliminated, since an exposure amount corresponding to the desired pattern on the mask 200A is enhanced in the exposure amount level of the desired diameter (or the threshold of the resist). Here, FIG. 30 is a view for depicting an effective light source shape.

Figure 31A:
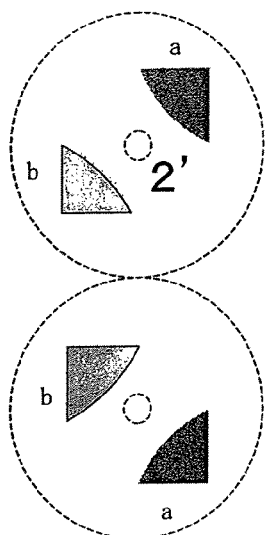
FIG. 31 is a typical view for explaining an effective light source distribution.
Figure 31B:
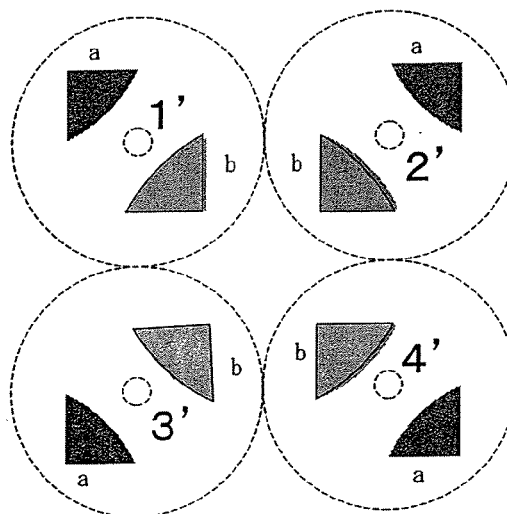
Figure 31C:
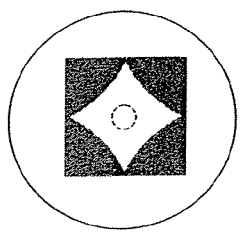

As discussed, only one diffracted beam enters the pupil plane 320, for example, through illumination that enables one diffracted beam 2 or 4 to enter the pupil plane 320 shown as a black sector in FIG. 28, and the illumination may be set as the dark and circular area "a" in an effective light source plane in FIG. 31A. As a result, the diffracted beams labeled by 2' or 4' respectively move to the area "b" as a bright rectangle. Since the diffracted beam 2 or 4 enters a black sector area shown in FIG. 28, the diffracted beam enters the pupil plane 320. Four circular effective light source areas "a" are combined as shown in FIG. 31B, and the effective light source distribution at this time form a circular effective light source as shown in FIG. 31C. Here, FIG. 31 is a typical view for explaining an effective light source distribution.

Figure 32:
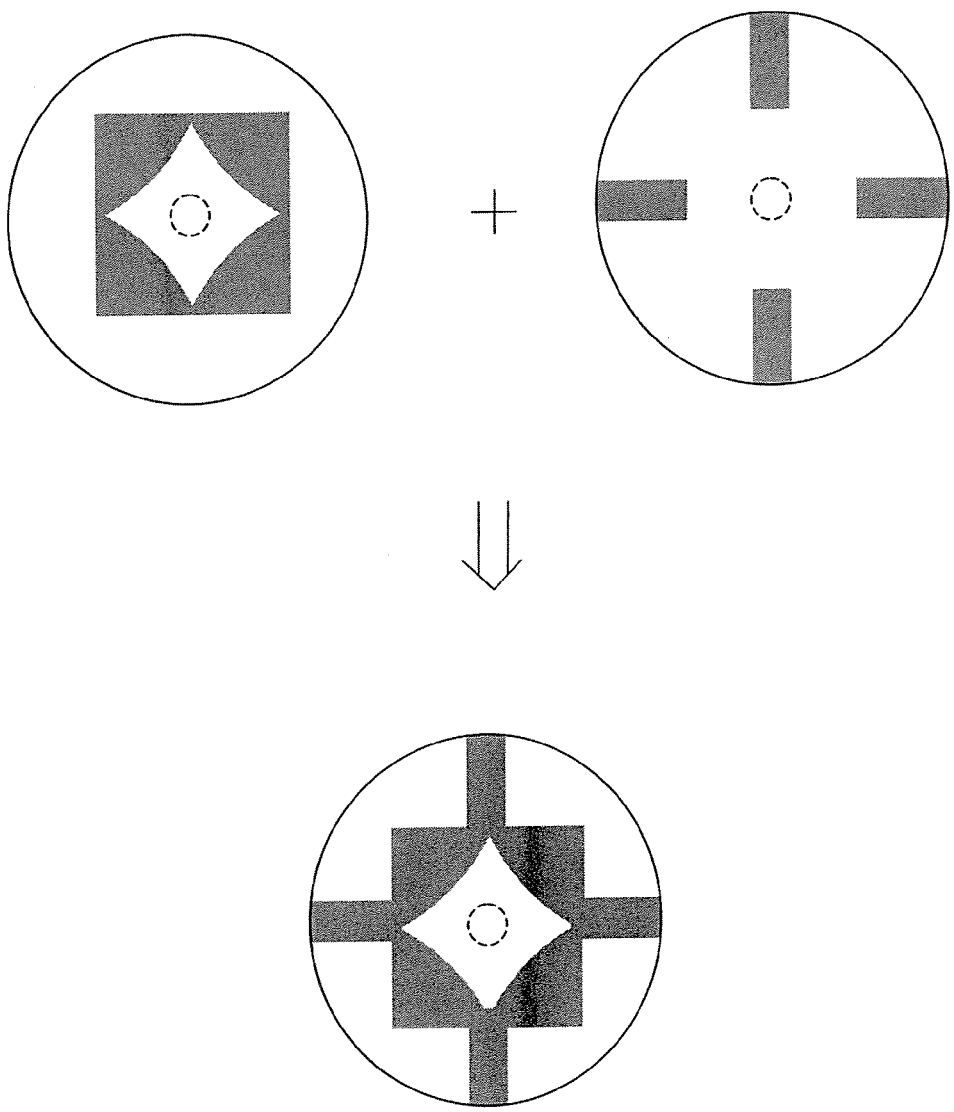
FIG. 32 is a view showing an effective light source distribution.

In this way, the crossed illumination shown in FIG. 32 that adds an effective light source distribution that enables two beams to enter the pupil (see FIG. 26C) and an effective light source distribution that enables one beam to enter the pupil (see FIG. 31C) is modified illumination which has a rectangular effective light source at its central part, and the center part of the rectangle has an effective light source of an approximately rhomb hollow. Such an effective light source strictly defines an area which only one diffracted beam enters, and efficiently a beam does not enter a useless area. Here, FIG. 32 is a view for showing an effective light source shape.

Figure 33A:
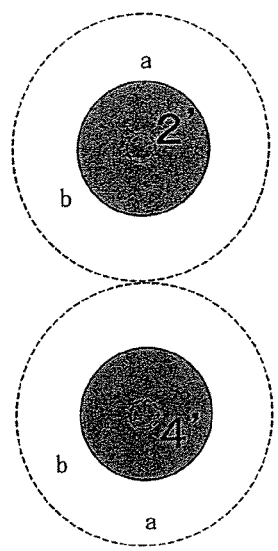
FIG. 33 is a typical view for explaining an effective light source distribution.
Figure 33B:
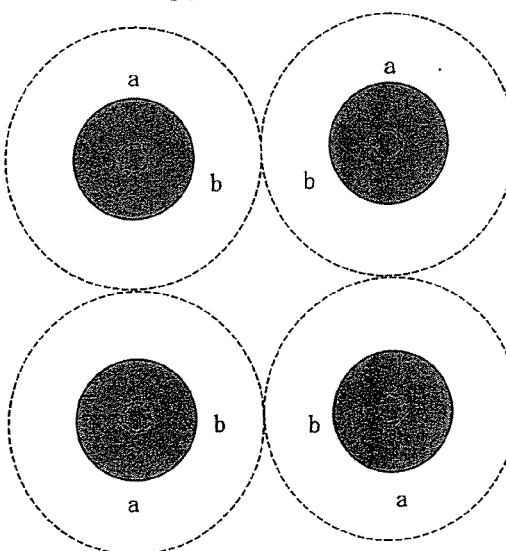
Figure 33C:
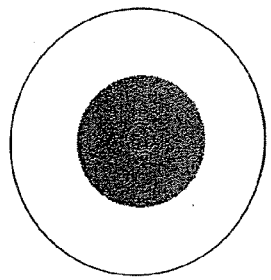

As discussed, only one diffracted beam enters the pupil plane 320, for example, through illumination that enables one diffracted beam 2 or 4 to enter a circle that inscribes the black sector in FIG. 28, and the illumination may be set as the dark and rectangular area "a" in an effective light source plane in FIG. 33A. As a result, the diffracted beams labeled by 2' or 4' respectively move to a circular area "b" that overlaps the area "a". Since the diffracted beam 2 or 4 enters an area that inscribes the black sector area shown in FIG. 28, the diffracted beam enters the pupil plane 320. Four rectangular effective light source areas "a" are combined as shown in FIG. 33B, and the effective light source distribution at this time form a rectangular effective light source as shown in FIG. 33C. Here, FIG. 33 is a typical view for explaining an effective light source distribution.

Figure 34:
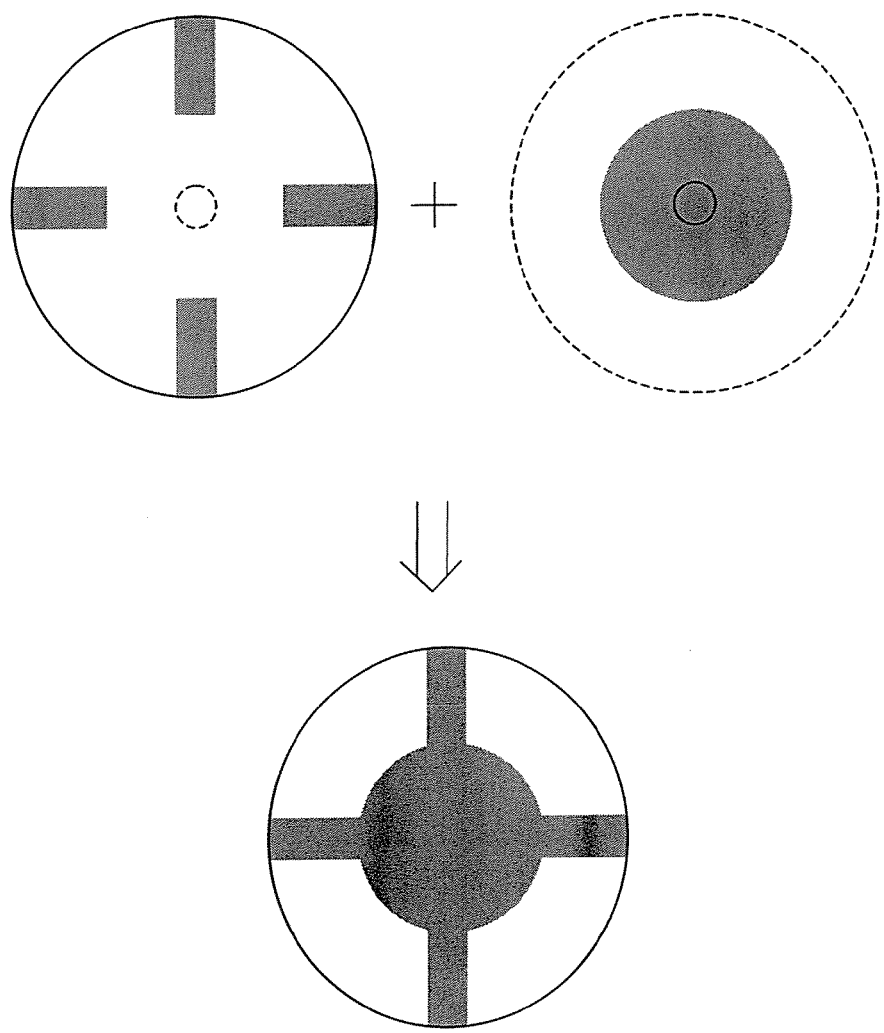
FIG. 34 is a view showing an effective light source distribution.

In this way, the crossed illumination shown in FIG. 34 that adds an effective light source distribution that enables two beams to enter the pupil (see FIG. 26C) and an effective light source distribution that enables one beam to enter the pupil (see FIG. 33C) is modified illumination which has a circular effective light source at its central part. Such an effective light source may easily set an area which one diffracted beam enters on the pupil, to be an effective light source. Here, FIG. 34 is a view for showing an effective light source shape.

As stated for a diffracted beam through the phase shift mask 200 with reference to FIGS. 25–34, it is understood that the above aperture stops 150G–150I provide such modified illumination, but it is, of course, necessary to determine a shape and size of the aperture stops 150G–150I by taking into account the characteristics of the diffracted beam.

Figure 19:
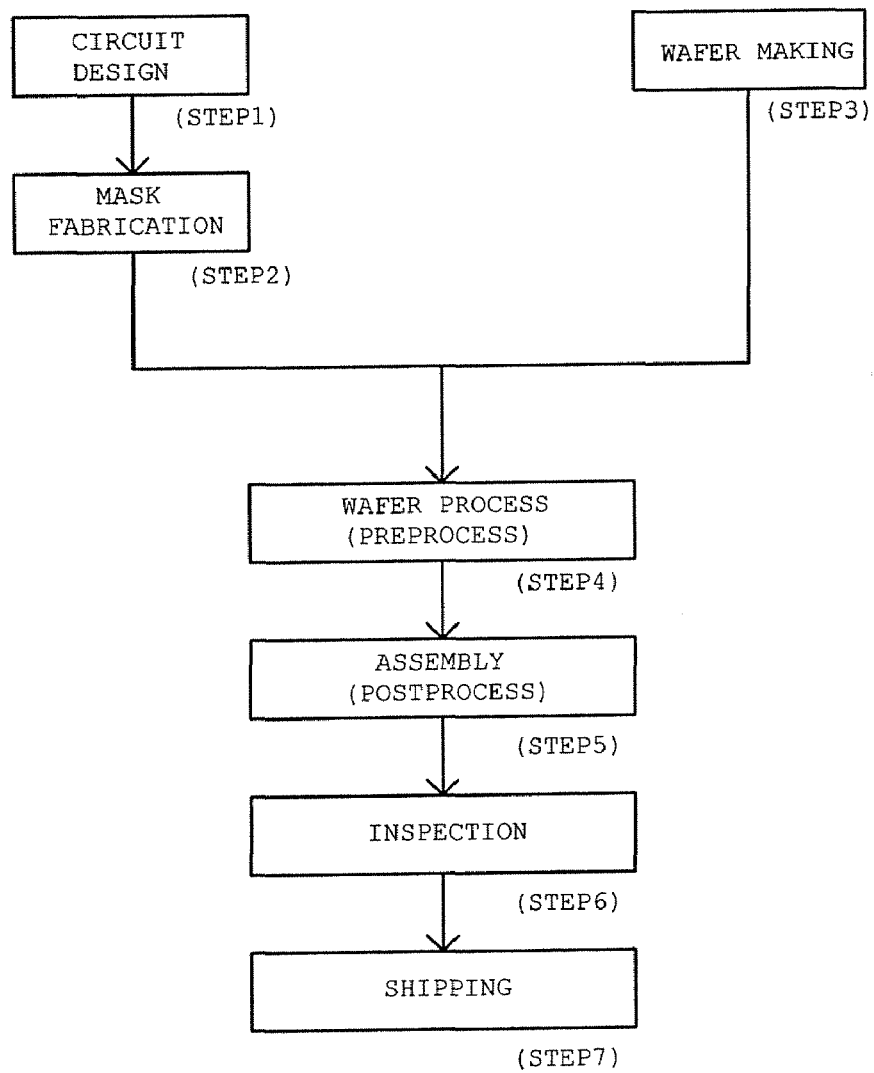
FIG. 19 is a flowchart for explaining a device fabricating method using the exposure apparatus of the present invention.

In case of small σ illumination using the mask 200 (or a half tone mask having different transmittance), a diffracted beam, except the 0-th order diffracted beam, deviates from the pupil plane 320 in the projection optical system 300 when a pitch between contact holes is small. As shown in FIG. 35, the 0-th order diffracted beam 10 passes the center of the pupil. Diffracted light of other orders on the pupil plane is located at a position different from that for the phase shift mask, i.e., as shown by diffracted beams 11–18. Therefore, the diffracted light except the 0-th order deviates, as shown in FIG. 19, from the pupil in the projection lens, and no pattern is formed in this condition. Here, FIG. 35 is a typical view showing a position of a diffracted beam on a pupil plane 320 for small σ illumination onto the binary mask 200 shown in FIG. 9 and, a diffracted beam moving position for oblique incidence illumination.

Figure 36:
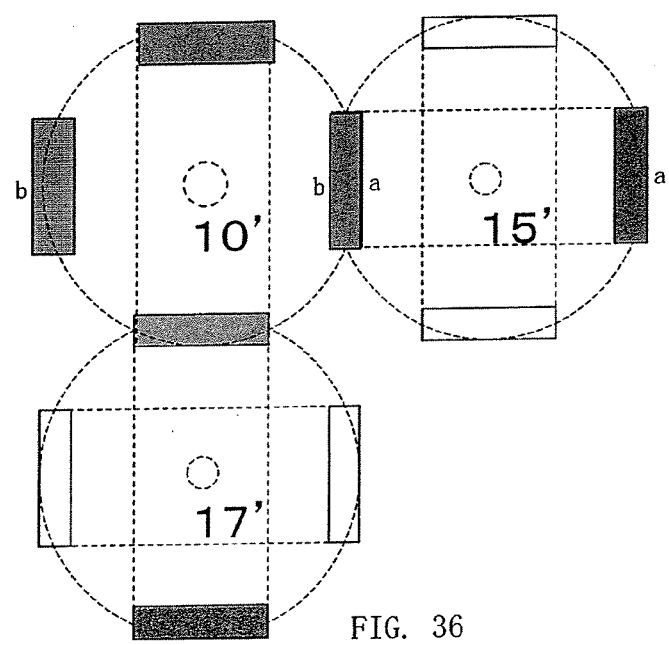
FIG. 36 is a typical view for explaining an effective light source distribution.
Figure 37:
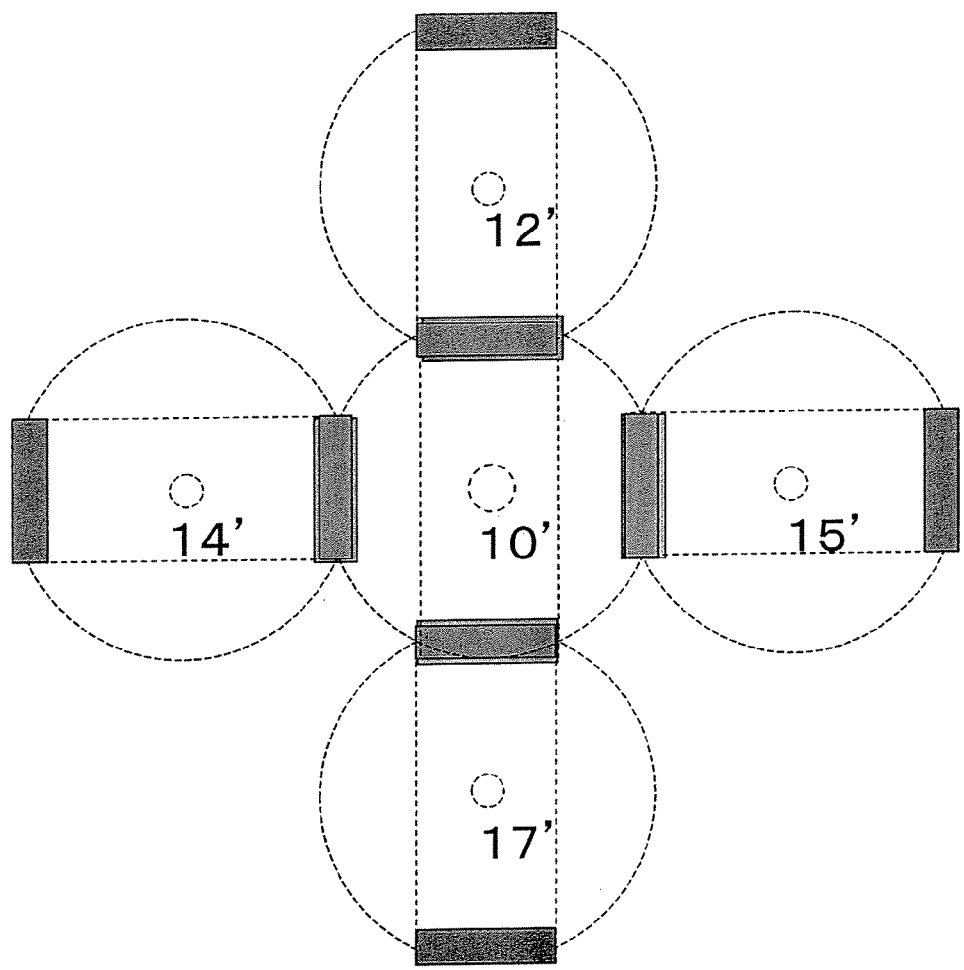
FIG. 37 is a typical view for explaining an effective light source distribution.

Accordingly, the illumination is required to enable the diffracted beams 11–18 to enter the pupil. For example, in order for two diffracted beams 10 and 15 as an example to enter a diagonal area on the pupil plane 320 shown in FIG. 35, the oblique incidence illumination is set for a dark and rectangular area "a" on the effective light source plane in FIG. 36. Thereby, the diffracted beams labeled by 10' and 15' respectively move to areas $b_1$ and $b_2$ depicted by a cross line and a diagonal, and enter both ends on the pupil in the projection optical system 300. Two diffracted beams enter the pupil with the effective light source shown by one rectangle, and result in interference, forming interference infringes at a regular interval on the plate 400. Similarly, the oblique incidence illumination may be set even for two diffracted beams 10 and 17 as described for the beams 10 and 15. Four rectangular effective light source areas "a" are combined as shown in FIG. 37, and linear interference infringes, which has a line shape with a regular pitch in longitudinal and transverse directions, cause part having strong intensity and part having weak intensity to appear two-dimensionally and periodically at intersections of overlapping light intensity on the plate 400. The effective light source at this time has, as shown in FIG. 40A, a crossed four-rectangle shape that extends in a direction orthogonal to the radial direction of the pupil.

Figure 38A:
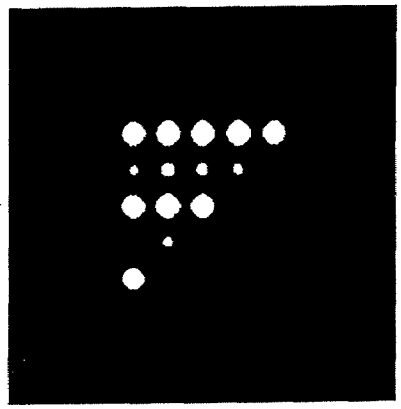
FIG. 38 is a view of a crossed (quadrupole) aperture stop and an inventive aperture stop, and shows a simulation of a resolution pattern on a plate surface using the aperture stops and oblique incidence illumination.
Figure 38A:
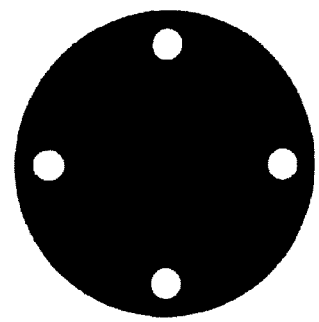
Figure 38B:
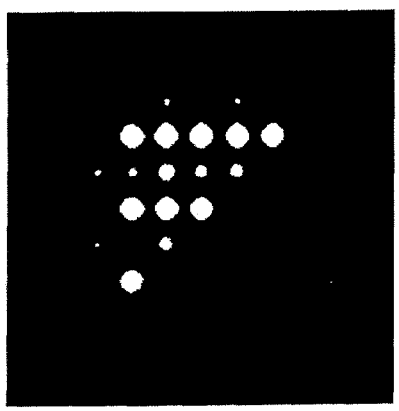
Figure 38B:
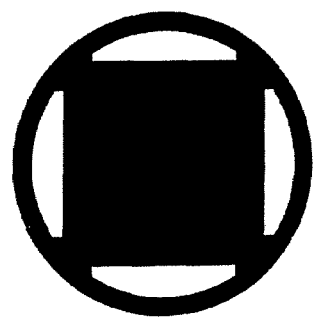

The mask 200 enlarges a desired part as the contact holes 210, and thus the part has larger intensity than the peripheral, forming the desired pattern of contact holes. However, mere crossed oblique incidence illumination would create a dummy resolution pattern on the plate 400, as shown in FIGS. 38A and 38B, which is an unnecessary pattern other than the desired contact hole pattern. Here, FIG. 38 is a view of a crossed aperture stop and an aperture stop of the instant embodiment, shows a simulation of a resolution pattern on a plate 400 using the aperture stops and oblique incidence illumination.

Accordingly, as shown in FIG. 35, except an area "c" that is defined by linearly connecting positions of two diffracted beams on the pupil plane 320, an effective light source distribution is added which enables only one diffracted light to enter the pupil plane 320. In this case, 0-th order beam is suitable for the one diffracted beam, since an oblique incidence angle may be made small. FIG. 39 shows one example of the effective light source distribution. Such illumination is available, for example, by enabling one diffracted beam 10' to enter the dark and sector area "a" in the effective light source plane. Thereby, the diffracted beam labeled by 10' moves to a bright and sector area b, and thus the diffracted light enters the pupil plane 320. There are four pieces corresponding to these conditions, forming an effective light source as shown in FIG. 40B.

Figure 38C:
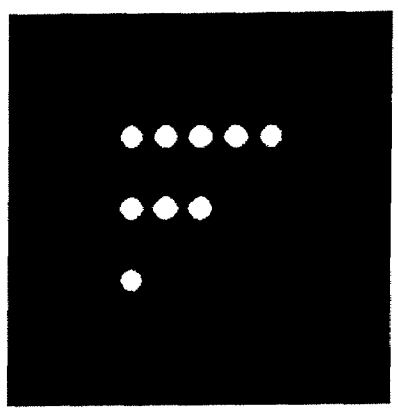
Figure 38C:
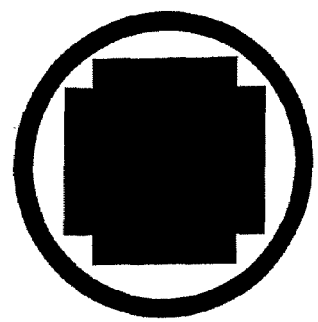

In this way, an addition of an effective light source distribution that enables two beams to enter the pupil (see FIG. 40A) to an effective light source distribution that enables one beam to enter the pupil (see FIG. 40B) is modified illumination which has a crossed hollow effective light source at its central part, as shown in FIG. 40C. The modified illumination having such an effective light source distribution provides a desired pattern on the plate 400 while the dummy resolution is eliminated as shown in FIG. 38C.

As described with reference to FIGS. 35–40, it is understood that the above aperture stop 150J provides such modified illumination, but it is, of course, necessary to determine a shape and size of the aperture stop 150J by taking into account the characteristics of the diffracted beam. The optimal length of a cross hollow differs according to pattern pitches, and such a modified illumination system is preferable whose crossed hollow part in the longitudinal direction in the optical system has such a size which prevents ±1st order diffracted beams, which have been generated by the pattern, from entering the pupil.

Figure 10:
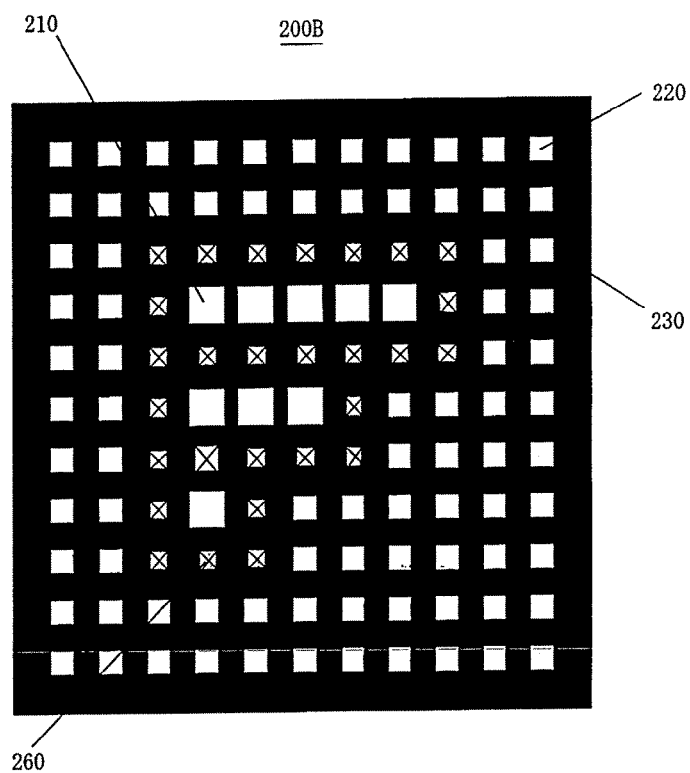
FIG. 10 is a schematic plan view showing another variation of the mask shown in FIG. 8.

The mask 200 may be replaced with the mask 200B shown in FIG. 10. Here, FIG. 10 is a schematic plan view of the mask 200B. The mask 200B is a binary mask having equal phases of the light transmitting parts, but different from the mask 200 in that the dummy contact holes 260 (marked with x) around the desired contact holes 210 have a hole diameter smaller than that of other dummy contact holes 220. The smaller hole diameter of the contact holes 260 may highlight the desired pattern of contact holes 210 rather than the dummy contact holes 220. Of course, the mask 200B may be formed as a phase shift mask like the mask 200A.

The projection optical system 300 includes an aperture stop 320 for forming an image onto the plate 400 from diffracted light that has passed through the contact hole pattern formed on the mask 200. The projection optical system 300 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit. As stated above, the shape of an effective light source formed on the pupil plane of the projection optical system 300 is the same as those shown in FIGS. 2–7.

The plate 400 is a wafer in the present embodiment, but it may include a liquid crystal plate and a wide range of other objects to be exposed. Photoresist is applied onto the plate 400. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 400 is supported by the wafer stage 450. The stage 450 may use any structure known in the art, and thus a detailed description of its structure and operations is omitted. For example, the stage 450 uses a linear motor to move the plate 400 in X-Y directions. The mask 200 and plate 400 are, for example, scanned synchronously, and the positions of the mask stage and wafer stage 450 (not shown) are monitored, for example, by a laser interferometer and the like, so that both are driven at a constant speed ratio. The stage 450 is installed on a stage surface plate supported on the floor and the like, for example, via a dumper, and the mask stage and the projection optical system 300 are installed on a body tube surface plate (not shown) supported, for example, via a dumper to the base-frame placed on the floor.

The image-forming position adjuster 500, which is connected to the stage 450, moves the plate 400, together with the stage 450, in a direction Z (shown in FIG. 1) within a range of the depth of focus, thus adjusting the image-forming position of the plate 400. The exposure apparatus performs a number of exposure operations for the plate 400 disposed in different positions to the direction Z, thereby eliminating dispersions in the image-forming performance within the depth of focus. The image-forming position adjuster 500 may use any techniques known in the art such as a rack (not shown) extensible in the direction Z, a pinion (not shown) connected to the stage 450 and mobile on the rack, a means for rotating the pinion and the like, and thus a detailed description thereof will be omitted.

In exposure operation, beams emitted from the laser 112 are reshaped into a desired beam shape by the beam shaping system 114, and then enter the illumination optical system 120. The condensing optical system 130 guides the beams, which passed through it, to the optical integrator 140 efficiently. At that time, the exposure-amount regulator 132 adjusts the exposure amount of the illumination light. The optical integrator 140 makes the illumination light uniform, and the aperture stop 150 forms the illumination light combining the illumination light having its peak near the optical axis and the illumination light having its peak off the axis. Such illumination light illuminates, through the condenser lens 160, the mask 200 under optimal conditions.

On the mask 200 is formed a contact pattern that two-dimensionally arranges the desired pattern of contact holes 210 and the dummy pattern of contact holes 220. Since the hole diameter of the desired contact holes 210 is made larger that of the dummy contact holes 220, the exposure amount will increase.

Beams having passed the mask 200 is demagnified and projected under a specific magnification onto the plate 400 due to the image-forming operation of the projection optical system 300. The exposure apparatus of a step-and-scan type would fix the light source section 110 and the projection optical system 300, and synchronously scan the mask 200 and plate 400, then exposing the entire shot. Further, the stage 450 of the plate 400 is stepped to the next shot, thus exposing and transferring a large number of shots on the plate 400. If the exposure apparatus is of a step-and-repeat type, exposure would be performed with the mask 200 and the plate 400 in a stationary state.

The illumination light having its peak off the axis would illuminate the mask 200, and form on the plate 400 the intensity distribution having highlighted contrast of a periodic contact hole pattern. The illumination light would illuminate the mask 200, and form on the plate 400 the intensity distribution of a aperiodic pattern having the highlighted desired pattern of contact holes 210. As a result of this, by appropriately selecting the threshold values of the resist on the plate 400, the pattern of the desired contact holes 210 can be formed onto the plate 400. As a result, the exposure apparatus can perform a pattern transfer to the resist with high precision, thus providing high-quality devices (such as semiconductor devices, LCD devices, photographing devices (such as CCDs, etc.), thin film magnetic heads, and the like).

Figure 20:
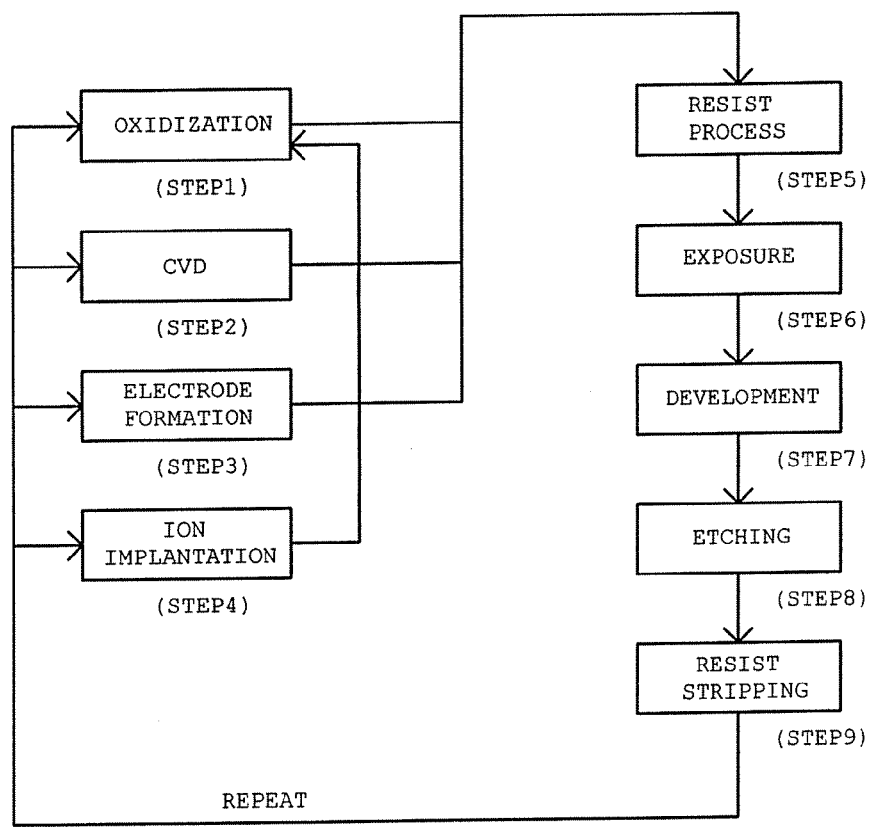
FIG. 20 is a detailed flowchart for step 4 shown in FIG. 19.

Referring to FIGS. 19 and 20, a description will now be given of an embodiment of a device fabricating method using the above mentioned exposure apparatus. FIG. 19 is a flowchart for explaining how to fabricate devices (i.e., semiconductor chips such as IC and LSI, LCDs, CCDs). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a posttreatment, forms into a semiconductor chip the wafer formed in step 4 and includes a assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 20 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer.

EXAMPLE 1

Figure 8:
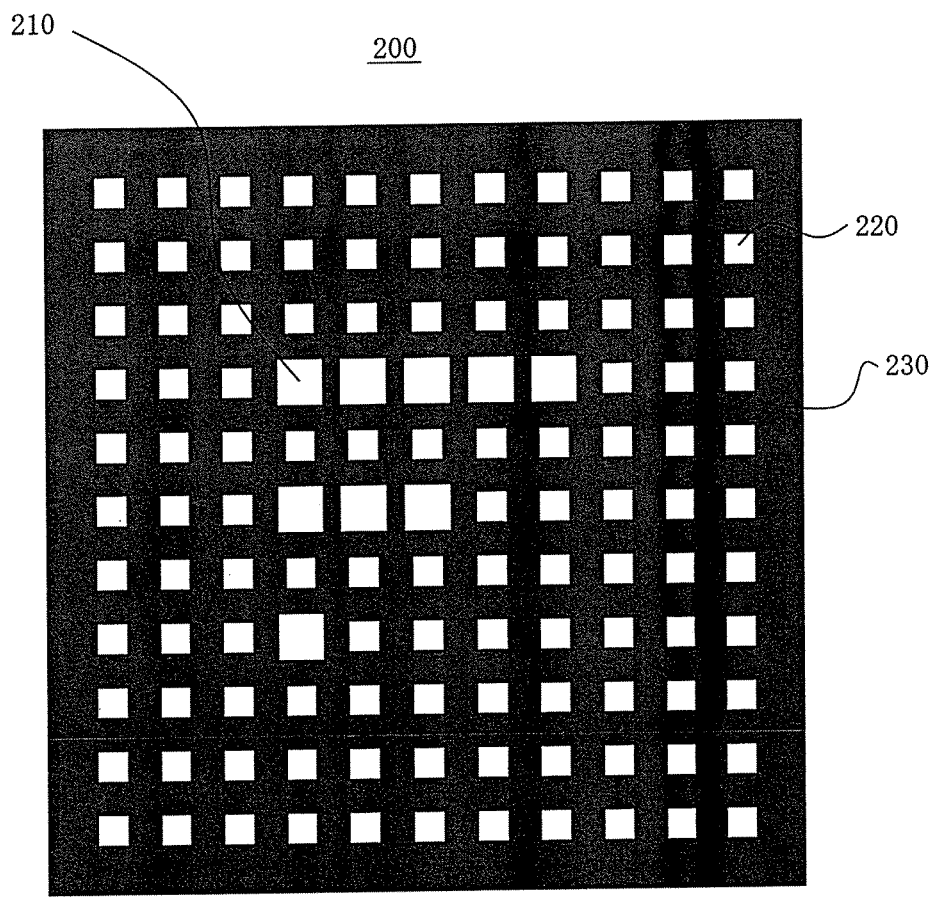
FIG. 8 is a schematic plan view of a mask in the exposure apparatus shown in FIG. 1.

The example 1 uses the binary mask 200 shown in FIG. 8, KrF excimer (with a wavelength of 248 nm) as the laser 112 and the projection optical system of NA=0.60 for the exposure apparatus. The mask 200 sets a hole diameter of the desired contact holes 210 to be 150 nm, which is larger than a hole diameter of the dummy contact holes 220 by only 30 nm. The aperture stop 150 uses the aperture stop 150A shown in FIG. 2 while setting σ of the illumination light having its peak near the optical axis (in other words, brought about by the circle 151) to be 0.2 and σ of the illumination light having its peak off the axis (in other words, brought about by four circles 152A) to be 0.9. The intensity ratio between small σ illumination light and large σ illumination light is set to be 0.9 to 1 by the exposure-amount regulator 132.

Figure 11:
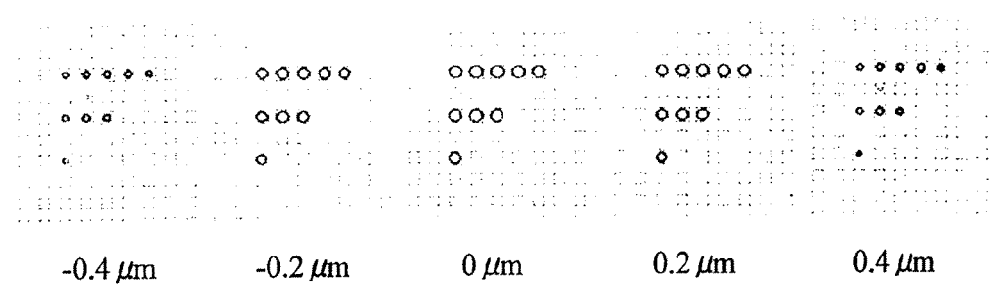
FIG. 11 is a pattern transferred to a plate as an exposure result of example 1.

The exposure result at this time is shown in FIG. 11. The figure shows the image-forming characteristics when the image-forming position adjuster 500 moves, for exposure, the plate 400 in the direction Z from −0.4 μm~+0.4 μm within the range of the DOF. It will be understood that the desired contact holes 210 are obtained in good condition in the range of −0.2 μm~+0.2 μm at a distance from the focus.

EXAMPLE 2

Figure 13:
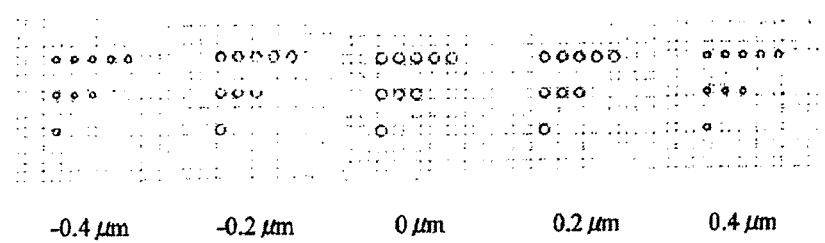
FIG. 13 is a pattern transferred to a plate as an exposure result of example 2.

The embodiment 2 uses the phase shift mask 200A shown in FIG. 9. In other respects (in other words, the structure of the exposure apparatus, illumination conditions, exposure amount, etc.), the same conditions were used as that in the example 1. The result at this time is shown in FIG. 13. It will be understood that a number of improvements have been made compared with the binary mask 200.

EXAMPLE 3

The example 3 is the same as the example 1 or 2 except that the mask 200B shown in FIG. 10 was used. This example makes a hole diameter of dummy contact holes 260 adjacent to desired contact holes 210, smaller by about 20 nm (therefore, about 100 nm) than that of other dummy contact holes 230. Control over the intensity of dummy patterns between the desired patterns of contact holes 210 improves the exposure amount. It is fairly effective to the improvement of the image-forming performance to automatically reduce the hole diameter of a dummy contact hole 260 adjacent to a desired contact hole 210, but the optimization may depend upon the number of adjacent holes and the distance in-between.

EXAMPLE 4

The example 4 repeats continuous exposure while changing, in the exposure, the image-forming position in the direction Z shown in FIG. 1 through the image-forming position adjuster 500. The structure of the exposure apparatus, mask arrangements, etc. are basically the same as those in the examples 1–3. This example performs multi-exposure at different distances from the focus position by moving the wafer stage 450 during exposure in the direction Z and repeating the exposure multiple times. Such exposure improves the image-forming characteristic at different positions within the range of the depth of focus.

EXAMPLE 5

The example 5 uses the phase shift mask 200A shown in FIG. 9, KrF excimer (with a wavelength of 248 nm) as the laser 112 and the projection optical system of NA=0.60 for the exposure apparatus. The mask 200A sets a hole diameter of the desired contact holes 210 to be 150 nm, which is larger than a hole diameter of the dummy contact holes 220 by only 30 nm. The aperture stop 150 uses the aperture stop 150G shown in FIG. 2, and employs first illumination light that enables two diffracted beams to enter the pupil plane in the projection optical system 400 (or illumination light resulted from four rectangles 155), and second illumination light that results from the rectangle 156 or an area that does not shield the first illumination light and excludes an area on the pupil plane 320, which is represented by using a straight line to connect two diffracted light positions. The intensity ratio between small σ illumination light and large σ illumination light is set to be 0.9 to 1 by the exposure-amount regulator 132.

Figure 41:
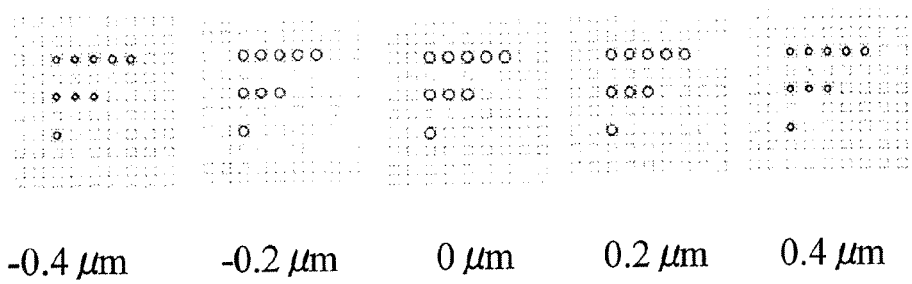
FIG. 41 is a pattern transferred onto a plate as a result of exposure in a fifth example.

The exposure result at this time is shown in FIG. 41. The figure shows the image-forming characteristics when the image-forming position adjuster 500 moves, for exposure, the plate 400 in the direction Z from −0.4 μm~+0.4 μm within the range of the DOF. It will be understood that the desired contact holes 210 are obtained in good condition in the range of −0.2 μm~+0.2 μm at a distance from the focus.

EXAMPLE 6

Figure 42:
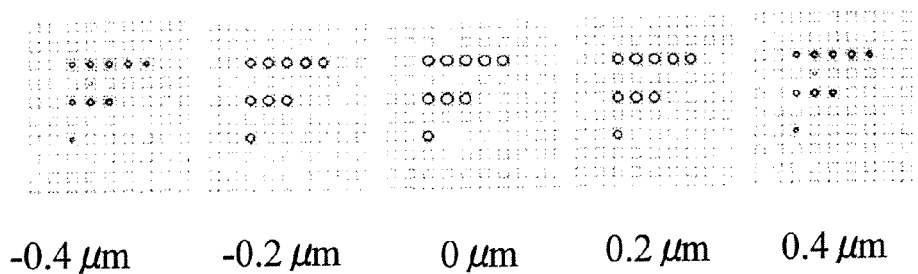
FIG. 42 is a pattern transferred onto a plate as a result of exposure in a sixth example.

The embodiment 6 uses the binary mask 200 shown in FIG. 8, and the aperture stop 150J. In other respects (in other words, the structure of the exposure apparatus, illumination conditions, exposure amount, etc.), the same conditions were used as that in the example 1. The result at this time is shown in FIG. 42. It will be understood that the desired contact holes 210 are obtained in good condition in the range of −0.2 μm~+0.2 μm at a distance from the focus.

EXAMPLE 7

The example 7 is the same as the example 5 or 6 except that the mask 200B shown in FIG. 10 was used. This example makes a hole diameter of dummy contact holes 260 adjacent to desired contact holes 210, smaller by about 20 nm (therefore, about 100 nm) than that of other dummy contact holes 230. Control over the intensity of dummy patterns between the desired patterns of contact holes 210 improves the exposure amount. It is fairly effective to the improvement of the image-forming performance to automatically reduce the hole diameter of a dummy contact hole 260 adjacent to a desired contact hole 210, but the optimization may depend upon the number of adjacent holes and the distance in-between.

EXAMPLE 8

The example 8 repeats continuous exposure while changing, in the exposure, the image-forming position in the direction Z shown in FIG. 1 through the image-forming position adjuster 500. The structure of the exposure apparatus, mask arrangements, etc. are basically the same as those in the examples 5–7. This example performs multi-exposure at different distances from the focus position by moving the wafer stage 450 during exposure in the direction Z and repeating the exposure multiple times. Such exposure improves the image-forming characteristic at different positions within the range of the depth of focus.

Thus, this example may transfer a fine contact hole pattern with a minimum critical dimension of 0.08–0.15 µm, with a good image-forming characteristic, onto the plate 400 at different positions within the depth of focus without exchanging the mask 200. In the example, the exposure apparatus using KrF excimer laser and NA=0.6 resolves a contact hole pattern with a minimum critical dimension and a minimum spacing both being 0.12 µm. If a resolution critical dimension is standardized using $k_1$, $k_1$=0.29 and the pitch is 0.29×2=0.58.

A description will now be given of a ratio of aperture areas between a first light transmitting part that contributes to resolution of a desired pattern, and a second light transmitting part that enhances an optical strength distribution for the desired pattern on the aperture stop in the illumination optical system.

Figure 43A:
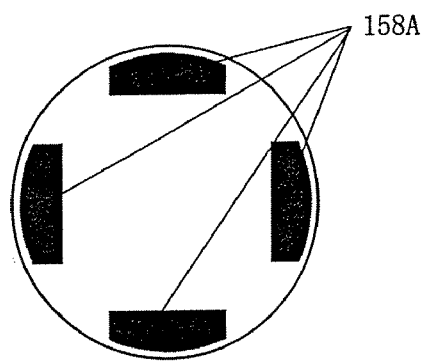
FIG. 43 is a pair of sub-stops obtained from FIG. 24.
Figure 43B:
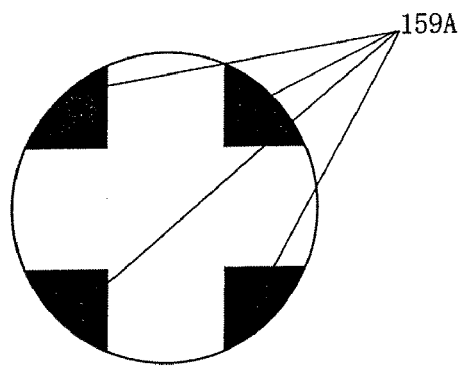

As an example, the aperture stop 150J is addressed. The aperture stop 150J shown in FIG. 24B may be functionally divided into two sub-stops $150J_1$ and $150J_2$ as shown in FIG. 43. FIG. 43A shows a plane view of the sub-stop $150J_1$, while FIG. 43B shows a plane view of the sub-stop $150J_2$. The apertures 158A correspond to the first light transmitting parts, whereas the apertures 159A correspond to the second light transmitting parts.

The apertures 158A effectively allow the 0-th order diffracted beam and either the +1st or −1st order diffracted beam to enter the pupil in the projection optical system 300, therefore contributing to resolution of a fine pattern. On the other hand, the apertures 159A allow the 0-th order diffracted beam to enter the pupil, but does not allow any of the +1st or −1st order diffracted beam to enter the pupil. Since the apertures 159A allow only one diffracted beam to enter the pupil, the desired pattern cannot be formed.

Figure 44A:
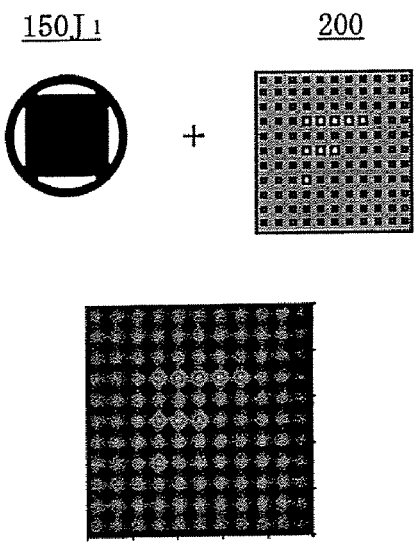
FIG. 44 is views for explaining functions of sub-stops shown in FIG. 43.
Figure 44B:
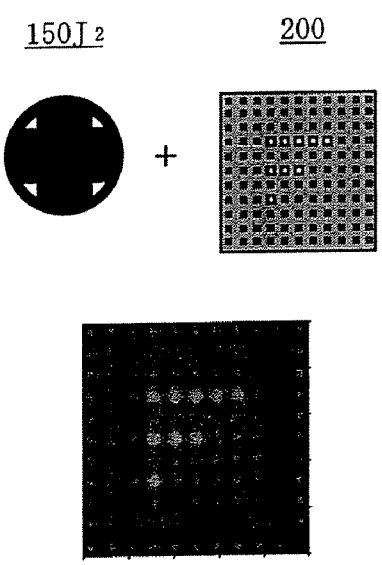

FIG. 44 is a result of simulation. Specifically, FIG. 44A combines the sub-stop $150J_1$ with the mask 200 shown in FIG. 8, where the desired contact hole has a size of 110 nm×110 nm, and the half pitch is set to be 110 nm. The pattern below was obtained as a result of interference between two beams, including the desired pattern of contact holes 210 and the dummy pattern of contact holes 220. On the other hand, FIG. 44B combines the sub-stop $150J_2$ with the mask 200 shown in FIG. 8, where the desired contact hole has a size of 110 nm×110 nm, and the half pitch is set to be 110 nm. The pattern below was obtained from one diffracted beam. Although the pattern in FIG. 44B enhances an outline of the desired pattern of contact holes 210, it does not resolve even the desired pattern of contact holes 210.

Figure 45:
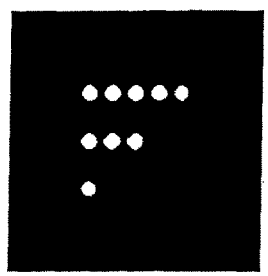
FIG. 45 is a pattern transferred onto a plate using the stop FIG. 24.

A combination of sub-stops $150J_1$ and $150J_2$, i.e., the stop 150J shown in FIG. 24B successfully resolves only the desired pattern of contact holes 210. FIG. 45 is a pattern when the stop 150J is combined with the mask 200, where a=0.7, b=0.5 and the maximum σ is 0.92. FIG. 45 clearly indicates the desired pattern of contact holes 210 without the dummy pattern of contact holes 220.

According to the instant inventors' review, a too large ratio of aperture areas between the first and second light transmitting parts would fail in resolving the desired pattern. On the other hand, a too small ratio of aperture areas between the first and second light transmitting parts would result in resolution of an undesired pattern in addition to the desired pattern.

EXAMPLE 9

Figure 46A:
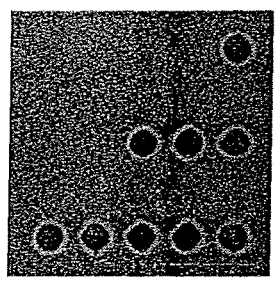
FIG. 46 is a pattern transferred to a plate as an exposure result of example 9.

Referring to FIG. 8, the projection exposure apparatus has a wavelength of 248 nm, and a NA of 0.73. The desired pattern of contact holes 210 has an interval of 120 nm in a lateral direction and an interval of 360 nm in a longitudinal direction when the desired pattern of contact holes 210 is converted on the plate 400. Each contact hole 210 has a size of 120 nm×120 nm. This means that the desired pattern of contact holes 210 has a period of 240 nm in the lateral direction and a period of 480 nm in the longitudinal direction when converted on the plate 400. The dummy pattern of contact holes 220 has a period of 240 nm in both transverse and longitudinal directions when the dummy pattern of contact holes 220 is converted on the plate 400. Each dummy hole 220 has a size of 90 nm×90 nm. The dummy pattern of contact holes 220 extends by three pieces outside the desired pattern 210. This example uses the aperture stop 150J where a=0.6, b=0.5, and the maximum σ is 0.92. The good experimental result has been obtained as shown in FIG. 46A.

Figure 46B:
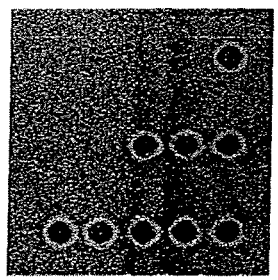

Another experiment also uses the mask 200 shown in FIG. 8. When converted on the plate 400, the desired pattern of contact holes 210 has a period of 220 nm in the lateral direction and a period of 440 nm in the longitudinal direction where the desired contact hole 210 has a size of 110 nm×110 nm. When converted on the plate 400, the dummy pattern of contact holes 220 has a period of 220 nm in both lateral and longitudinal directions where each dummy contact hole having a size of 90 nm×90 nm. This example uses the aperture stop 150J where a=0.7, b=0.5, and the maximum σ is 0.92. The good experimental result has been obtained as shown in FIG. 46B. The ratio of aperture areas 158A and 159A is 0.20 in FIG. 24B.

Figure 46C:
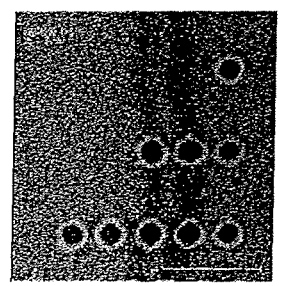

Still another experiment also uses the mask 200 shown in FIG. 8. When converted on the plate 400, the desired pattern of contact holes 210 has a period of 200 nm in the lateral direction and a period of 400 nm in the longitudinal direction where the desired contact hole 210 has a size of 100 nm×100 nm. When converted on the plate 400, the dummy pattern of contact holes 220 has a period of 200 nm in both lateral and longitudinal directions where each dummy contact hole having a size of 80 nm×80 nm. This example uses the aperture stop 150G in FIG. 21 where a=0.8, b=0.6, and the maximum σ is 0.92. The good experimental result has been obtained as shown in FIG. 46C. The ratio of aperture areas 155 and 156 is about 0.06 in FIG. 21.

In this example, a shape and size of the desired contact hole 210 is adjusted. That is, a size of the isolated contact hole 210 is slightly made larger otherwise its light strength becomes small.

After investigating various patterns, the instant inventors have found that it is effective to vary a size of the light blocking area according to patterns. In the aperture stop 150J in FIG. 24B, when a=0.8, b=0.4, and the maximum σ is 0.90, the ratio of aperture areas 158A and 159A is about 1.30. When a=0.8, b=0.6, and the maximum σ=0.92, the ratio of aperture areas 158A and 159A is about 0.06. For the stops 150A–150C, the ratio is about 0.25.

Figure 47A:
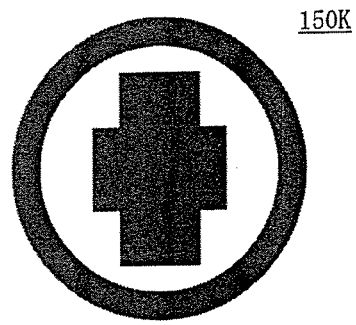
FIG. 47 is a schematic plane view showing exemplary shapes of three aperture stops.
Figure 47B:
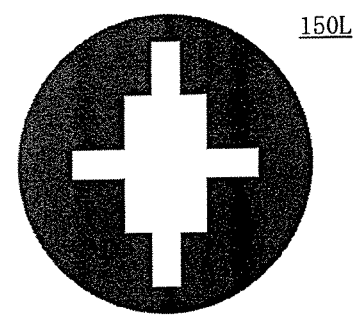
Figure 47C:
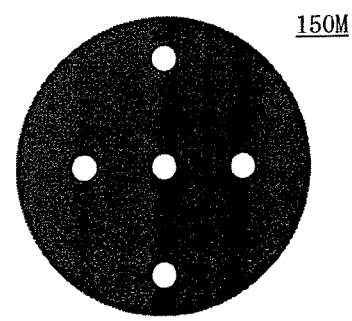

This resultant ratio applies to half tone masks and those stops 150K, 150L, and 150M shown in FIG. 47. Each of these stops 150K, 150L and 150M has different periods in longitudinal and lateral directions, and is of rotational symmetry of 180°.

EXAMPLE 10

Figure 48:
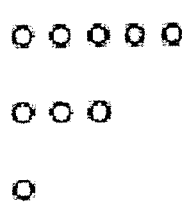
FIG. 48 is a pattern transferred to a plate as an exposure result of example 10.

While the example 9 uses a binary mask, this example uses a phase shift mask 200A shown in FIG. 9. The projection exposure apparatus has a wavelength of 248 nm, and a NA of 0.73. When converted on the plate 400, the desired pattern of contact holes 210 has a period of 200 nm in the lateral direction and a period of 400 nm in the longitudinal direction where the desired contact hole 210 has a size of 100 nm×100 nm. When converted on the plate 400, the dummy pattern of contact holes 220 has a period of 200 nm in both lateral and longitudinal directions where each dummy contact hole having a size of 80 nm×80 nm. This example uses the aperture stop 150G in FIG. 21 where a=0.2, b=0.1, and the maximum σ is 0.92. The good experimental result has been obtained as shown in FIG. 48. The ratio of aperture areas 155 and 156 is about 0.28 in FIG. 21. Other conditions are the same as those for the example 9.

Usually, a≦0.3 and b≦0.2 for most phase shift masks. When the maximum σ is in the range from 0.9 to 1.0, a ratio of aperture areas between the first and second light transmitting parts would be in the range between about 0.13 to about 0.75.

In order to resolve the desired pattern of contact holes, the examples 9 and 10 show that about 0.06 to about 1.30 would be suitable range for the ratio of aperture areas between a first light transmitting part that contributes to resolution of a desired pattern, and a second light transmitting part that enhances an optical strength distribution for the desired pattern on the aperture stop in the illumination optical system. In the above various aperture stops, it is preferable to vary the light blocking area, because the above ratio becomes easily controllable.

Next follows a description of a relationship of a hole diameter between the desired and dummy contact holes. When a hole diameter of the dummy contact hole is too large or too close to that of the desired contact hole, the dummy pattern of contact holes is undesirably resolved. On the other hand, when the hole diameter of the dummy contact hole is too small, the periodicity with which the dummy pattern provides the desired pattern would be lost. It is generally true that the larger the hole diameter of the dummy contact hole is, the better the light utilization efficiency and thus the throughput are. Therefore, the relationship of a hole diameter between the desired and dummy contact holes is important.

EXAMPLE 11

Figure 49A:
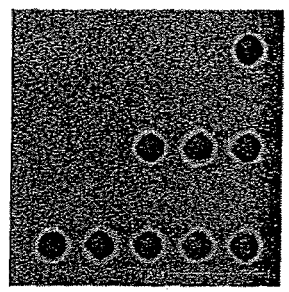
FIG. 49 is a pattern transferred to a plate as an exposure result of example 11.

Referring to FIG. 8, the projection exposure apparatus has a wavelength of 248 nm, and a NA of 0.73. The desired pattern of contact holes 210 has an interval of 120 nm in a lateral direction and an interval of 360 nm in a longitudinal direction when the desired pattern of contact holes 210 is converted on the plate 400. Each contact hole 210 has a size of 120 nm×120 nm. This means that the desired pattern of contact holes 210 has a period of 240 nm in the lateral direction and a period of 480 nm in the longitudinal direction when converted on the plate 400. The dummy pattern of contact holes 220 has a period of 240 nm in both transverse and longitudinal directions when the dummy pattern of contact holes 220 is converted on the plate 400. Each dummy hole 220 has a size of 90 nm×90 nm, corresponding to 75% of the size of the contact hole 210. The dummy pattern of contact holes 220 extends by three pieces outside the desired pattern 210. This example uses the aperture stop 150J where a=0.6, b=0.5, and the maximum σ is 0.92 in FIG. 24B. The good experimental result has been obtained as shown in FIG. 49A. This experiment has changed a size of the dummy contact hole from 70 nm to 100 nm (corresponding to about 58% to about 83% of the size of the contact hole 210), and confirmed good resolution of the desired pattern of contact holes 210.

Figure 49B:
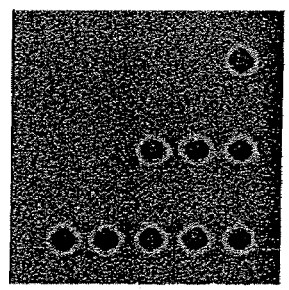

Another experiment also uses the mask 200 shown in FIG. 8. When converted on the plate 400, the desired pattern of contact holes 210 has a period of 220 nm in the lateral direction and a period of 440 nm in the longitudinal direction where the desired contact hole 210 has a size of 110 nm×110 nm. When converted on the plate 400, the dummy pattern of contact holes 220 has a period of 220 nm in both lateral and longitudinal directions where each dummy contact hole having a size of 90 nm×90 nm, corresponding to about 82% of the size of the contact hole 210. This example uses the aperture stop 150J where a=0.7, b=0.5, and the maximum σ is 0.92 in FIG. 24B. The good experimental result has been obtained as shown in FIG. 49B. This experiment has changed a size of the dummy contact hole from 70 nm to 90 nm (corresponding to about 64% to about 82% of the size of the contact hole 210), and confirmed good resolution of the desired pattern of contact holes 210.

Figure 49C:
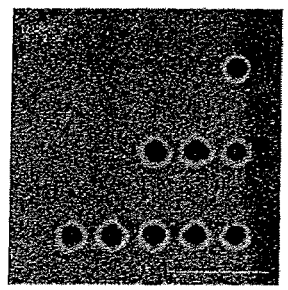

Still another experiment also uses the mask 200 shown in FIG. 8. When converted on the plate 400, the desired pattern of contact holes 210 has a period of 200 nm in the lateral direction and a period of 400 nm in the longitudinal direction where the desired contact hole 210 has a size of 100 nm×100 nm. When converted on the plate 400, the dummy pattern of contact holes 220 has a period of 200 nm in both lateral and longitudinal directions where each dummy contact hole having a size of 80 nm×80 nm, corresponding to 80% of the size of the contact hole 210. This example uses the aperture stop 150J in FIG. 24B where a=0.8, b=0.6, and the maximum σ is 0.92. The good experimental result has been obtained as shown in FIG. 49C. This experiment has changed a size of the dummy contact hole from 70 nm to 90 nm (corresponding to 70% to 90% of the size of the contact hole 210), and confirmed good resolution of the desired pattern of contact holes 210.

In this example, a shape and size of the desired contact hole 210 is adjusted. That is, a size of the isolated contact hole 210 is slightly made larger otherwise its light strength becomes small.

After investigating various patterns, the instant inventors have found that it is preferable to set the dummy contact hole to have a hole diameter corresponding to about 55% to about 90% of the hole diameter of the desired contact hole. This resultant ratio applies to half tone and phase shift masks.

Further, the present invention is not limited to these preferred embodiments, and various modifications and changes may be made in the present invention without departing from the spirit and scope thereof.

Thus, the mask, the exposure method and the apparatus of the present invention may expose a contact hole pattern having a fine hole diameter (e.g., or 0.15 μm or less) and a mixture of isolated contact holes and contact hole lines at once with high resolution. In addition, a device fabricating method utilizing such an exposure method and apparatus can fabricate high-quality devices.

What is claimed is:

1. A projection exposure method comprising the steps of:
providing a mask that arranges a contact hole pattern and a plurality of auxiliary patterns with each being smaller than the contact hole pattern; and
illuminating the mask with first illumination light for resolving the contact hole pattern, and second illumination light for preventing a false resolution caused by the auxiliary patterns and the first illumination,
wherein the first and second illumination light form an effective light source that has a non-circular dark portion at a center portion thereof,
the first illumination light forms the parts of the effective light source in each of radially longitudinal directions of 0°, 90°, 180°, and 270°,
the second illumination light forms the parts of the effective light source in each of radially longitudinal directions of 45°, 135°, 225° and 315°,
the radially longitudinal direction of 0° is a direction that the contact hole pattern and the auxiliary patterns line up.

2. An exposure method according to claim 1, wherein the contact hole pattern on the mask has a diameter different from an original diameter to be formed on the target.

3. An exposure method according to claim 1, wherein the first illumination enables two diffracted beams generated from the contact hole pattern to be incident upon a pupil plane in the projection optical system, and the second illumination preventing any diffracted beam from being incident upon an area on the pupil plane which area is defined by linearly connecting the two diffracted beams.

4. An exposure method according to claim 3, wherein the second illumination light is set so that only one diffracted beam is incident upon the pupil plane.

5. An exposure method according to claim 1, wherein the effective light source has a σ larger than 0.9.

6. An exposure method according to claim 1, wherein a size of the auxiliary patterns adjacent to the desired pattern, is made smaller than that of other auxiliary patterns.

7. An exposure method according to claim 1, wherein the mask uses a binary or halftone mask.

8. An exposure method according to claim 1, wherein the effective light source has a σ larger than 1.0 at an outer circumference.

9. An exposure method according to claim 1, wherein the contact hole pattern and the auxiliary pattern are two-dimensionally arranged like a matrix.

10. An exposure method according to claim 1, wherein a shape of the auxiliary pattern is analogous to the desired pattern.

11. A projection exposure method according to claim 1, wherein a length from center in the direction of 0°, the direction of 90°, the direction of 180° and the direction of 270° to edge of the dark portion is longer than a length from center in the direction of 45°, the direction of 135°, the direction of 225° and the direction of 315° to edge of the dark portion.

12. A projection exposure method according to claim 11, wherein the dark portion is cross shape.

13. An exposure method according to claim 12, wherein the effective light source has one of the shapes of (1) having a cross-shaped light blocking portion at the center of an annular ring with a predetermined width thereby forming four rectangular effective light sources at the edge of the cross-shaped central light blocking portion in a radially longitudinal direction at angles of 0°, 90°, 180° and 270° thereby also forming four effective light source sectors in a radially longitudinal direction at angles of 45°, 135°, 225° and 315° wherein each of the four rectangular effective light sources is extended to the annular ring, and (2) having the shape of (1) wherein each of the four rectangular effective light sources is not extended to the annular ring.

14. A projection exposure method comprising the steps of:
providing a mask that arranges a plurality of contact hole patterns and a plurality of auxiliary patterns each being smaller than each contact hole pattern; and
illuminating the mask with first illumination light for resolving the contact hole patterns, and second illumination light for preventing a false resolution caused by the auxiliary patterns and the first illumination,
wherein the mask is a phase shift mask,
the first and second illumination light form an effective light source,
a length from a center toward each of radially longitudinal directions of 0°, 90°, 180° and 270° to edge of of the effective light source is longer than a length from the center toward each of radially longitudinal directions of 45°, 135°, 225° and 315° to edge of the effective light source,
the first illumination light forms the parts of the effective light source in each of radially longitudinal directions of 0°, 90°, 180° and 270°,
the radially longitudinal direction of 0° is a direction that the contact hole patterns and the auxiliary patterns line up.

15. An exposure method according to claim 14, wherein the effective light source has one of the shapes of (1) having a rectangular effective light source at the center and four rectangular effective light sources formed at the edge of the central rectangular effective light source each in a radially longitudinal direction at angles of 0°, 90°, 180° and 270°, (2) having an approximately rhomb shaped light blocking area at the center of the central rectangular effective light source of the shape (1), and (3) having a circular effective light source at its center of a circular light blocking portion and four rectangular effective light sources formed at the edge of the central rectangular effective light source in a radially longitudinal direction at angles of 0°, 90°, 180° and 270°.

16. An exposure method comprising the steps of:
providing a mask that arranges a contact hole pattern and a plurality of auxiliary patterns with each being smaller than the contact hole pattern;
illuminating the mask with a light that forms an effective light source that has a non-circular dark part at a center; and
projecting the contact hole pattern onto an object via a projection optical system,
wherein the contact hole pattern and the auxiliary pattern are arranged in lengthwise and breadthwise to the mask, and the effective light source has four bright parts that are arranged in a cross corresponding to a lengthwise and breadthwise axis direction of the contact hole pattern and the auxiliary pattern.

17. An exposure method comprising the steps of:
providing a mask that arranges a contact hole pattern and an auxiliary pattern smaller than the contact hole pattern;
illuminating the mask with illumination light that form an effective light source having a dark portion at a center; and projecting the contact hole pattern onto an object using a projecting optical system, wherein the contact hole pattern and the auxiliary pattern are arranged on the mask along at least a first direction, and wherein the dark portion of the effective light source is a cross-shaped that has axes in the first direction and in a second direction that is orthogonal to the first direction.

18. An exposure method according to claim 17, wherein the contact hole pattern and the auxiliary pattern are arranged on the mask along the first direction and the second direction.

19. An exposure method according to claim 17, wherein the mask is a bianary or halftone mak.

* * * * *